United States Patent
Xu et al.

(10) Patent No.: US 11,916,558 B1
(45) Date of Patent: Feb. 27, 2024

(54) DDR PHY PARALLEL CLOCK PATHS ARCHITECTURE

(71) Applicant: QUALCOMM Incorporated, San Diego, CA (US)

(72) Inventors: Yong Xu, San Diego, CA (US); Boris Dimitrov Andreev, San Diego, CA (US); Vikas Mahendiyan, San Diego, CA (US); Yuxin Li, San Diego, CA (US); Anand Meruva, San Diego, CA (US); Jeffrey Mark Hinrichs, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 18/080,728

(22) Filed: Dec. 13, 2022

(51) Int. Cl.
*H03L 7/00* (2006.01)
*G06F 1/12* (2006.01)
*H03K 19/20* (2006.01)
*H03L 7/081* (2006.01)

(52) U.S. Cl.
CPC .............. *H03L 7/0812* (2013.01); *G06F 1/12* (2013.01); *H03K 19/20* (2013.01)

(58) Field of Classification Search
CPC .......... H03L 7/0812; G06F 1/12; H03K 19/20
USPC ........................................................ 327/269
See application file for complete search history.

(56) References Cited

U.S. PATENT DOCUMENTS

| | | | |
|---|---|---|---|
| 6,839,301 B2 | 1/2005 | Lin et al. | |
| 8,594,264 B1 | 11/2013 | Zhu et al. | |
| 9,178,502 B2 | 11/2015 | Francom et al. | |
| 10,630,272 B1* | 4/2020 | Ashtiani | H03K 5/133 |
| 11,329,654 B2 | 5/2022 | Choi et al. | |
| 2005/0024107 A1* | 2/2005 | Takai | H03L 7/087 327/158 |
| 2005/0084050 A1* | 4/2005 | Cheung | H03L 7/07 375/375 |
| 2006/0192602 A1* | 8/2006 | Lee | H03L 7/095 327/158 |
| 2007/0046347 A1* | 3/2007 | Lee | H03L 7/0814 327/158 |
| 2012/0266009 A1* | 10/2012 | Momoi | H04L 7/10 713/401 |
| 2017/0125077 A1* | 5/2017 | Choi | H03K 5/14 |
| 2017/0230052 A1* | 8/2017 | Jeong | H03L 7/091 |
| 2021/0250030 A1* | 8/2021 | Abuellil | H03L 7/0814 |
| 2021/0250031 A1* | 8/2021 | Abuellil | H03L 7/0814 |
| 2022/0050805 A1 | 2/2022 | Nassif et al. | |

* cited by examiner

*Primary Examiner* — Ryan Jager
(74) *Attorney, Agent, or Firm* — Loza & Loza, LLP

(57) ABSTRACT

A method for clock switching includes propagating a first clock signal through a first clock path, propagating a second clock signal through a second clock path, generating a first delay control signal based on the first clock signal, and generating a second delay control signal based on the second clock signal. The method also includes, in a first mode, coupling the first clock path to a delay circuit and inputting the first delay control signal to a control input of the delay circuit. The method also includes, in a second mode, coupling the second clock path to the delay circuit and inputting the second delay control signal to the control input of the delay circuit.

29 Claims, 15 Drawing Sheets

DDR PHY PARALLEL CLOCK PATHS ARCHITECTURE

BACKGROUND

Field

Aspects of the present disclosure relate generally to clocks, and, more particularly, to clock paths.

Background

A system may include a clock source (e.g., a phase-locked loop) configured to generate a clock signal for timing operations of one or more circuits in the system. The system may also include a clock path for distributing the clock signal from the clock source to the one or more circuits.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a system. The system includes a first clock path, a second clock path, a delay circuit, and a first multiplexer having a first input, a second input, and an output, wherein the first input of the first multiplexer is coupled to the first clock path, the second input of the first multiplexer is coupled to the second clock path, and the output of the first multiplexer is coupled to the delay circuit. The system also includes a first delay control circuit having an input and an output, wherein the input of the first delay control circuit is coupled to the first clock path, and a second delay control circuit having an input and an output, wherein the input of the second delay control circuit is coupled to the second clock path. The system further includes a second multiplexer having a first input, a second input, and an output, wherein the first input of the second multiplexer is coupled to the output of the first delay control circuit, the second input of the second multiplexer is coupled to the output of the second delay control circuit, and the output of the second multiplexer is coupled to a control input of the delay circuit.

A second aspect relates to method for clock switching. The method includes propagating a first clock signal through a first clock path, propagating a second clock signal through a second clock path, generating a first delay control signal based on the first clock signal, and generating a second delay control signal based on the second clock signal. The method also includes, in a first mode, coupling the first clock path to a delay circuit and inputting the first delay control signal to a control input of the delay circuit. The method also includes, in a second mode, coupling the second clock path to the delay circuit and inputting the second delay control signal to the control input of the delay circuit.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
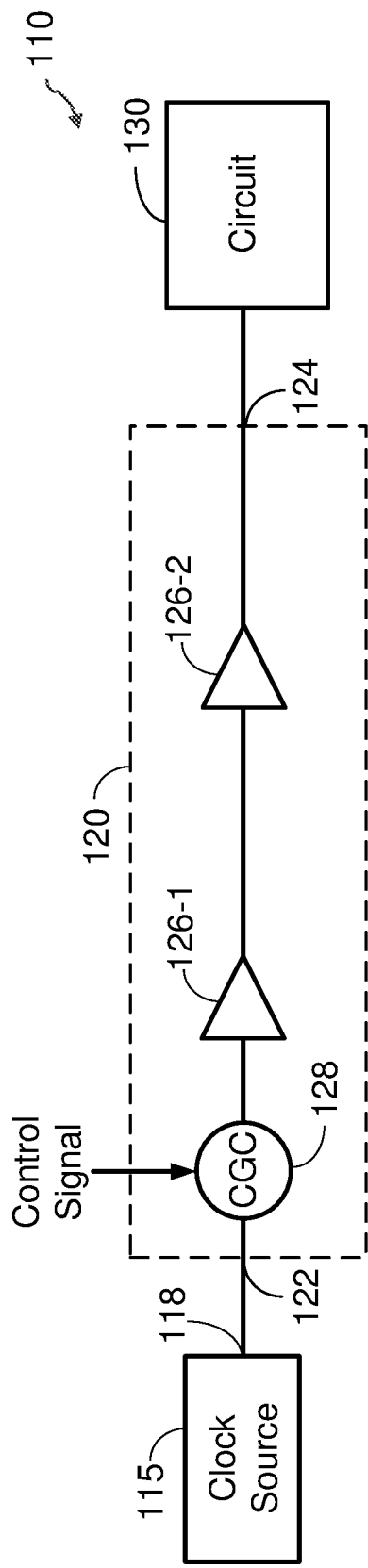
FIG. 1 shows an example of a system including a clock path according to certain aspects of the present disclosure.

FIG. 1 shows an example of a system 110 including a clock source 115, a clock path 120, and a circuit 130 according to certain aspects. The circuit 130 may include sequential logic, one or more transmitters, a processor, a memory, etc. The clock source 115 is configured to generate a clock signal and output the clock signal at an output 118 of the clock source 115. The clock source 115 may be implemented with a phase-locked loop (PLL) or another type of clock source.

The clock path 120 has an input 122 coupled to the output 118 of the clock source 115 and an output 124 coupled to the circuit 130. The clock path 120 is configured to receive the clock signal at the input 122 and distribute the clock signal to the circuit 130. The clock signal is used for timing operations of the circuit 130. As used herein, a "clock signal" may be a periodic signal that oscillates between high and low. As used herein, a "clock path" may include one or more components (e.g., clock buffers) through which a clock signal propagates.

In the example shown in FIG. 1, the clock path 120 includes clock buffers 126-1 and 126-2 and a clock gating circuit 128. Each of the clock buffers 126-1 and 126-2 is configured to drive the clock signal through the clock path 120 (e.g., to enable the clock signal to propagate longer distances and/or drive larger loads). Each of the clock buffers 126-1 and 126-2 may be implemented with one or more inverters (e.g., complementary inverters) or another type of clock buffer. It is to be appreciated that the clock path 120 may include a different number of clock buffers than shown in the example in FIG. 1. The number of clock buffers 126-1 and 126-2 in the clock path 120 may depend on, for example, the length of the clock path 120, the drive strengths of the clock buffers 126-1 and 126-2, the load of the circuit 130, etc.

The clock gating circuit 128 is configured to pass the clock signal or gate (i.e., block) the clock signal based on a control signal from a control circuit (not shown). For example, the clock gating circuit 128 may be configured to pass the clock signal when the control signal has a first logic value, and gate the clock signal when the control signal has a second logic value. The first logic value may be logic one and the second logic value may be logic zero, or vice versa. However, it is to be appreciated that the control signal is not limited to this example.

In certain aspects, the control circuit (not shown) may cause the clock gating circuit 128 to pass the clock signal (e.g., by setting the control signal to the first logic value) when the circuit 130 is active, and cause the clock gating circuit 128 to gate the clock signal (i.e., by setting the control signal to the second logic value) when the circuit 130 is in an idle mode (i.e., not active) to save power. When the clock gating circuit 128 gates the clock signal, the clock gating circuit 128 may output a static logic value (e.g., one or zero). The static logic value may eliminate or significantly reduce dynamic power consumption in the circuit 130 and the components (e.g., clock buffers 126-1 and 126-2) located downstream of the clock gating circuit 128.

Although one clock gating circuit 128 is shown in the example in FIG. 1, it is to be appreciated that the clock path 120 may include two or more clock gating circuits (e.g., at different locations along the clock path 120). It is also to be appreciated that the clock path 120 may include multiple branches (not shown) forming a clock tree (i.e., clock distribution network) to distribute the clock signal to one or more other circuits (not shown) in addition to the circuit 130 shown in FIG. 1. It is also to be appreciated that the clock path 120 may include one or more additional components not shown in FIG. 1.

Figure 2:
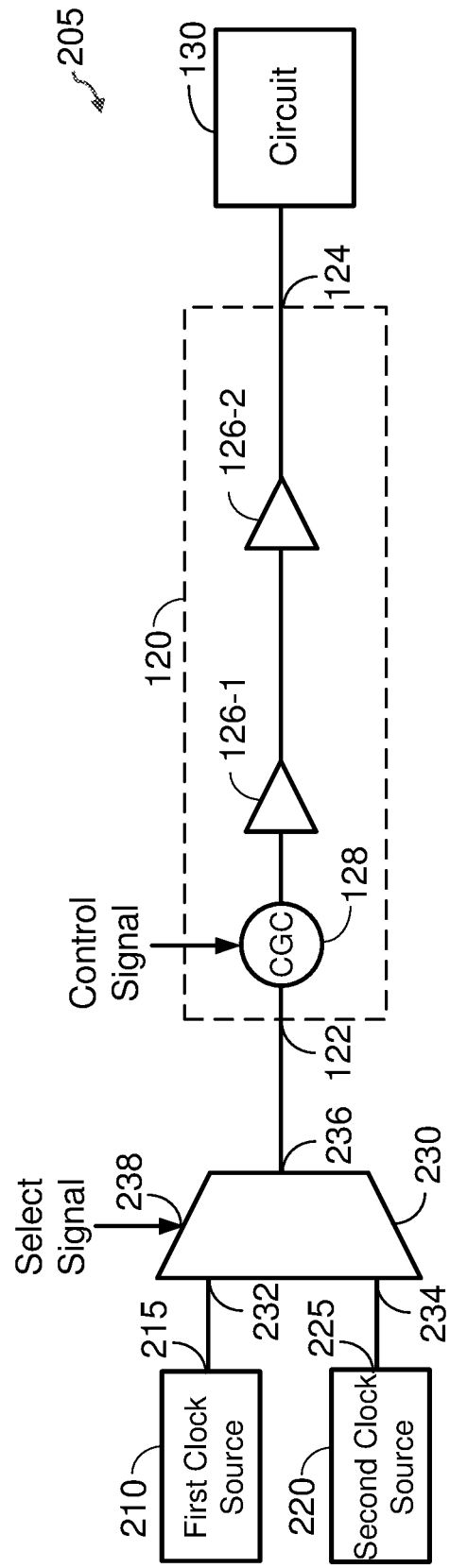
FIG. 2 shows an example of a system including a multiplexer for switching a clock path between multiple clock sources according to certain aspects of the present disclosure.

FIG. 2 shows an example of a system 205 including the clock path 120, the circuit 130, a first clock source 210, a second clock source 220, and a multiplexer 230. As discussed further below, the multiplexer 230 is used for switching the clock path 120 between the first clock source 210 and the second clock source 220.

In this example, the multiplexer 230 has a first input 232, a second input 234, a select input 238, and an output 236 coupled to the input 122 of the clock path 120. The first clock source 210 has an output 215 coupled to the first input 232 of the multiplexer 230, and the second clock source 220 has an output 225 coupled to the second input 234 of the multiplexer 230. The first clock source 210 is configured to generate a first clock signal and output the first clock signal at the output 215. The second clock source 220 is configured to generate a second clock signal and output the second clock signal at the output 225. Each of the clock sources 210 and 220 may be implemented with a respective PLL or another type of clock source. In certain aspects, the first clock signal has a first clock frequency and the second clock signal has a second clock frequency, in which the first clock frequency is different from the second clock frequency. This allows the multiplexer 230 to switch the circuit 130 between the first clock frequency and the second clock frequency by switching the clock path 120 between the first clock source 210 and the second clock source 220, as discussed further below.

In certain aspects, the multiplexer 230 is configured to receive a select signal at the select input 238, select one of the first input 232 and the second input 234 based on the select signal, and couple the selected one of the first input 232 and the second input 234 to the output 236. Thus, the multiplexer 230 passes the first clock signal to the clock path 120 when the first input 232 is selected, and passes the second clock signal to the clock path 120 when the second input 234 is selected. In certain aspects, the multiplexer 230 may select the first input 232 when the select signal has a first logic value, and select the second input 234 when the select signal has a second logic value. The first logic value may be logic one and the second logic value may be logic zero, or vice versa. However, it is to be appreciated that the select signal is not limited to this example.

In certain aspects, the select signal is controlled by the control circuit (not shown). In these aspects, the control circuit may cause the multiplexer 230 to select the first input 232 (e.g., by setting the select signal to the first logic value) to operate the circuit 130 at the first clock frequency, and cause the multiplexer 230 to select the second input 234 (e.g., by setting the select signal to the second logic value) to operate the circuit 130 at the second clock frequency. The control circuit may select the first clock signal or the second clock signal based on, for example, a performance mode of the circuit 130, a data rate of the circuit 130, and/or another parameter.

Although two clock sources (i.e., the first clock source 210 and the second clock source 220) are shown in the example in FIG. 2, it is to be appreciated that the system 205 is not limited to two clock sources. For example, in some implementations, the system 205 may include three or more clock sources, in which the multiplexer 230 is configured to select one of the three or more clock sources based on the select signal.

Figure 3:
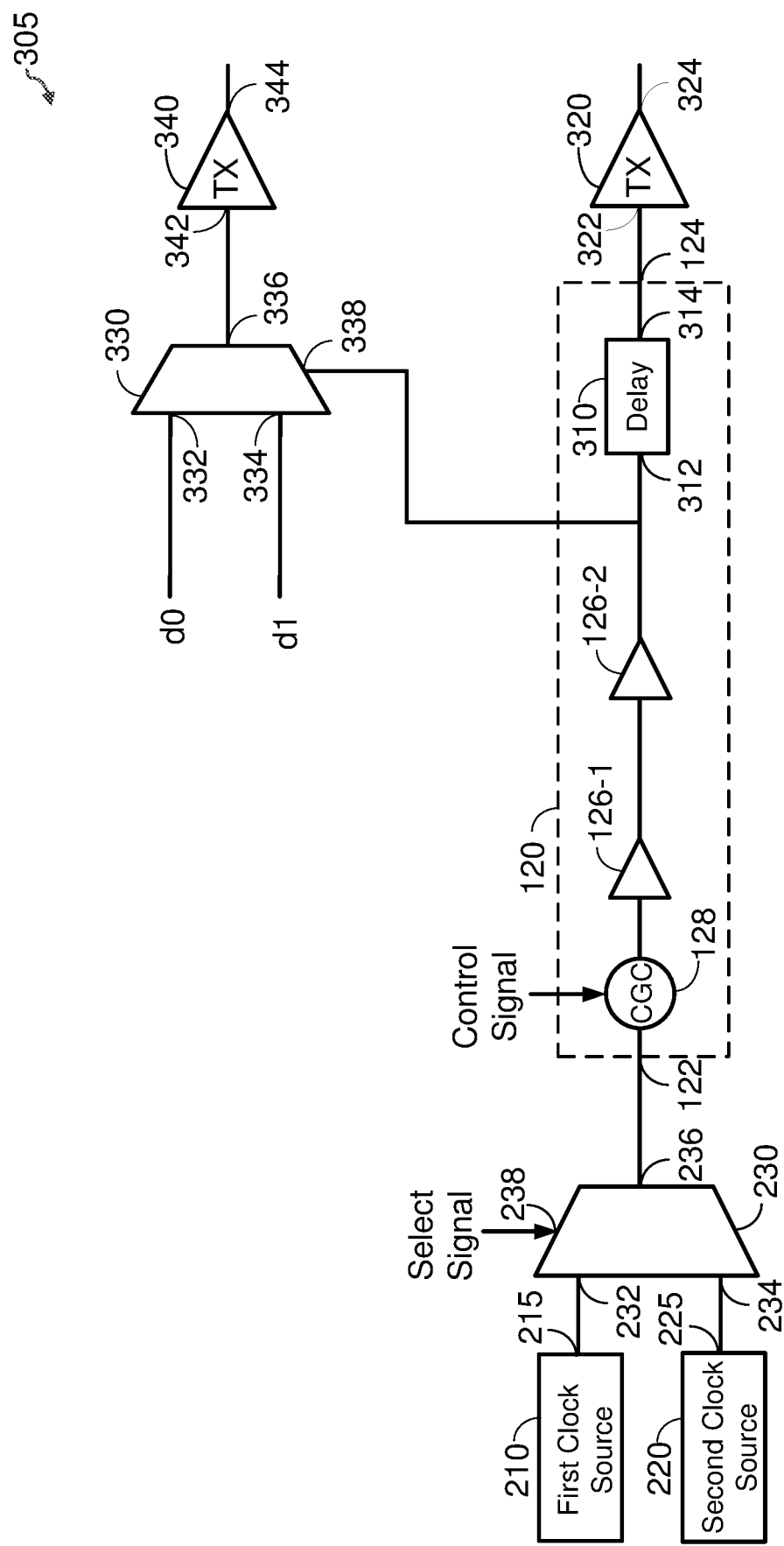
FIG. 3 shows an example of a clock path including a delay circuit according to certain aspects of the present disclosure.

The multiplexer 230, the first clock source 210, the second clock source 220, and the clock path 120 may be used, for example, in an interface circuit to facilitate the transfer of data from a first chip to a second chip. In this regard, FIG. 3 shows an example of a system 305 configured to transfer data from a first chip to a second chip according to certain aspects. In this example, the system 305 may be integrated on the first chip, which is coupled to the second chip (not shown) via multiple links (not shown). In one example, the system 305 is used in a memory interface circuit that interfaces a memory controller on the first chip with a memory (e.g., a double data rate (DDR) memory or a low power DDR (LPDDR) memory) on the second chip. However, it is to be appreciated that the system 305 is not limited to this example.

In the example shown in FIG. 3, the system 305 includes the multiplexer 230, the first clock source 210, the second clock source 220, and the clock path 120 discussed above with reference to FIGS. 1 and 2. The system 305 also includes a clock transmitter 320 (also referred to as a driver), a data multiplexer 330, and a data transmitter 340.

The clock transmitter 320 has an input 322 coupled to the output 124 of the clock path 120, and an output 324 coupled to the second chip (not shown) via a link (not shown). The clock transmitter 320 is configured to receive a clock signal from the clock path 120, and transmit the clock signal to the second chip via the link. The clock signal from the clock path 120 may be the selected one of the first clock signal and the second clock signal from the multiplexer 230 (i.e., the clock transmitter 320 transmits the first clock signal when the multiplexer 230 selects the first input 232, and transmits the second clock signal when the multiplexer 230 selects the second input 234).

The data multiplexer 330 is used to transfer data to the second chip at a double data rate (DDR), in which the data is sampled at the second chip on both the rising edges and the falling edges of the clock signal received by the second chip. The data multiplexer 330 has a first input 332, a second input 334, a select input 338, and an output 336. The first input 332 is configured to receive a first data signal d0 and the second input 334 is configured to receive a second data signal dl. In certain aspects, data bits to be transmitted to the second chip are divided into even data bits and odd data bits by data logic (not shown) on the first chip. In these aspects, the first data signal d0 includes the odd data bits and the second data signal dl includes the even data bits, or vice versa. Each of the first data signal d0 and the second data signal dl transfers the respective data bits at a single data rate (SDR) (i.e., one bit per clock cycle). As discussed further below, the data multiplexer 330 is configured to combine the first data signal d0 and the second data signal dl into a DDR data signal that alternates between the odd data bits and the even data bits.

In the example shown in FIG. 3, the data transmitter 340 has an input 342 coupled to the output 336 of the data multiplexer 330, and an output 344 coupled to the second chip (not shown) via a link (not shown). The data transmitter 340 is configured to receive the DDR data signal from the output 336 of the data multiplexer 330, and transmit the DDR data signal to the second chip via the link A data sampler (not shown) at the second chip may sample the received DDR data signal on both the rising and falling edges of the clock signal received by the second chip from the clock transmitter 320.

The select input 338 of the data multiplexer 330 is coupled to the clock path 120 to receive the clock signal in the clock path 120. The clock signal may be the selected one of the first clock signal and the second clock signal from the multiplexer 230. The select input 338 may be coupled to the clock path 120 at various locations (i.e., points) along the clock path 120, and is therefore not limited to the exemplary location shown in FIG. 3. In operation, the data multiplexer 330 is configured to couple the first input 332 to the output 336 when the clock signal at the select input 338 is high (i.e., logic one) and couple the second input 334 to the output 336 when the clock signal at the select input 338 is low (i.e., logic zero). This causes the data multiplexer 330 to output one odd data bit from the first data signal d0 and one even data bit from the second data signal dl per cycle (i.e., period) of the clock signal. Thus, the data multiplexer 330 outputs two data bits (i.e., one odd data bit and one even data bit) per cycle of the clock signal, thereby achieving double data rate.

In the example shown in FIG. 3, the clock path 120 further includes a delay circuit 310 used to adjust the timing of the clock signal in the clock path 120 (i.e., the selected one of the first clock signal and the second clock signal). The delay circuit 310 has an input 312 and an output 314. In the example shown in FIG. 3, the input 312 is coupled to delay buffer 126-2 and the output 314 is coupled to the output 124 of the clock path 120. However, it is to be appreciated that the present disclosure is not limited to this example, and that the delay circuit 310 may be placed at a different location in the clock path 120.

In operation, the delay circuit 310 is configured to receive the clock signal at the input 312, delay the clock signal by a delay of the delay circuit 310, and output the delayed clock signal at the output 314. In certain aspects, the delay of the delay circuit 310 is used to adjust the timing of the clock signal with respect to the DDR data signal or another signal. For example, the delay of the delay circuit 310 may be used to center align the clock signal with the DDR data signal, in which edges of the clock signal are located between bit transitions in the DDR data signal. Center alignment may be achieved, for example, by setting the delay of the delay circuit 310 to approximately one quarter of a cycle (i.e., one period) of the clock signal to shift the clock signal by 90 degrees. However, it is to be appreciated that the present disclosure is not limited to this example, and that other delays may be used. In general, the delay of the delay circuit 310 may be set to a delay that achieves a desired timing relationship between the clock signal and the DDR data signal or between the clock signal and another signal.

Although aspects of the present disclosure are discussed above using the example of DDR, it is to be appreciated that the present disclosure is not limited to DDR. For example, the exemplary system 305 may also be used to facilitate single data rate (SDR) data transfer, in which the data transmitter 340 transmits a SDR data signal. In this example, the data multiplexer 330 may be replaced with a circuit (e.g., a latch or flip flop) that is clocked by the clock signal from the clock path 120, and outputs one data bit per clock cycle to the data transmitter 340. In this example, the delay circuit 310 may delay the clock signal, for example, by half a clock cycle to center align the clock signal with the SDR data signal. However, it is to be appreciated that the present disclosure is not limited to this example.

Figure 4:
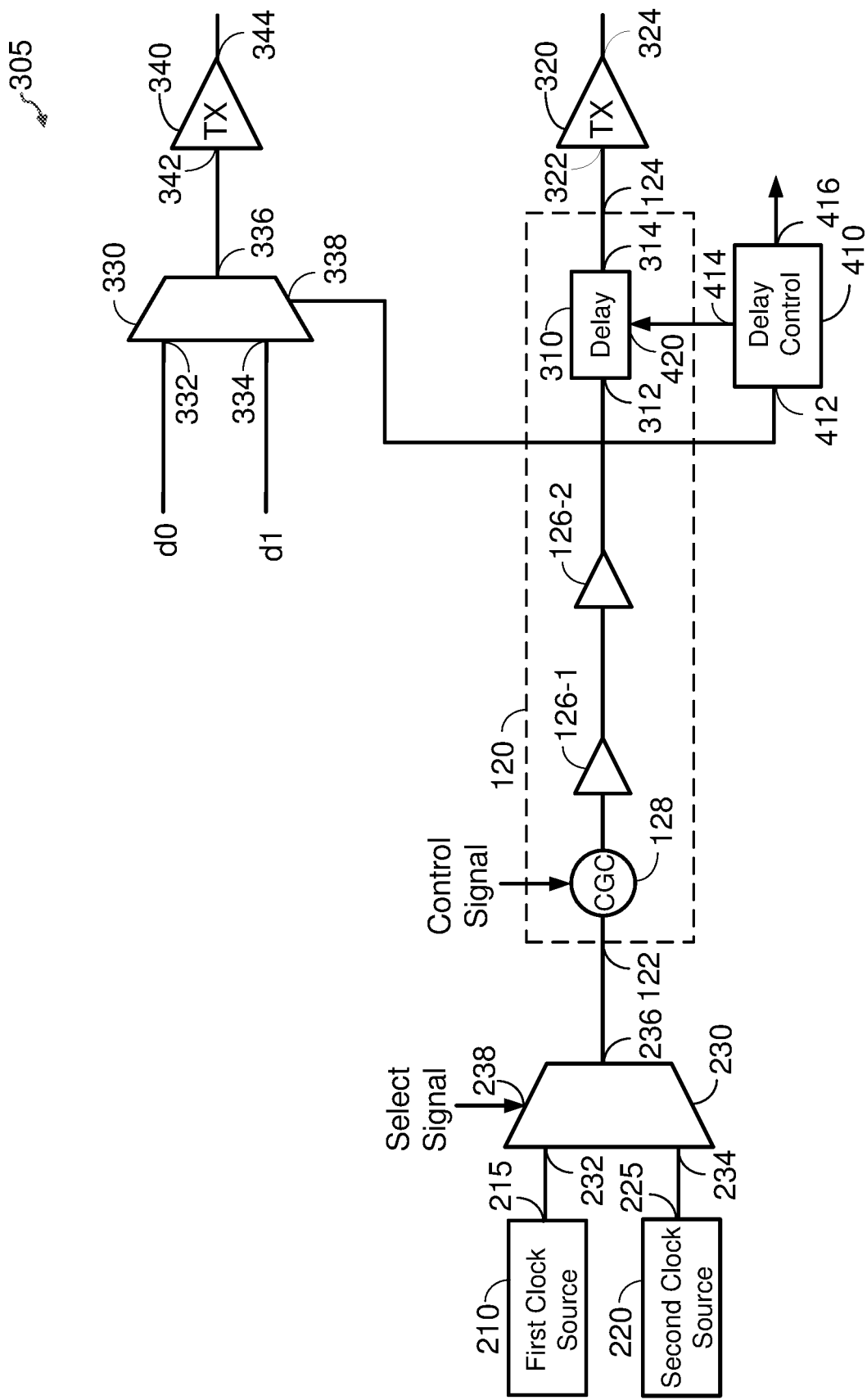
FIG. 4 shows an example of a delay control circuit configured to control the delay of a delay circuit according to certain aspects of the present disclosure.

In certain aspects, the delay of the delay circuit 310 may be controlled by a delay control circuit. In this regard, FIG. 4 shows an example in which the system 305 further includes a delay control circuit 410 configured to control the delay of the delay circuit 310 according to certain aspects. In this example, the delay circuit 310 has a control input 420, and is configured to set the delay of the delay circuit 310 based on a delay control signal received at the control input 420 from the delay control circuit 410. The delay control circuit 410 has an input 412 coupled to the input 312 of the delay circuit 310, and an output 414 coupled to the control input 420 of the delay circuit 310.

In this example, the delay control circuit 410 is configured to receive the clock signal at the input 412, and use the clock signal as a timing reference to set the delay of the delay circuit 310 using the delay control signal. For example, the delay control circuit 410 may use the clock signal as a timing reference to set the delay of the delay circuit 310 to a desired fraction of one cycle (i.e., one period) of the clock signal. For example, for a DDR system, the delay control circuit 410 may set the delay of the delay circuit 310 to approximately one quarter of a clock cycle to center align the clock signal with the DDR data signal. However, it is to be appreciated that the present disclosure is not limited to this example. In general, the delay control circuit 410 may set the delay of the delay circuit 310 to a delay corresponding to a fraction of one clock cycle that achieves a desired timing relationship between the clock signal and the DDR data signal or between the clock signal and another signal.

In certain aspects, the delay control circuit 410 may also have a status output 416 for outputting a status signal indicating a status of the delay control circuit 410. For example, when the delay control circuit 410 first receives a clock signal (e.g., the first clock signal or the second clock signal), the delay control circuit 410 may need time to lock onto the clock signal. In this example, the delay control circuit 410 may output a status signal indicating when the delay control circuit 410 has locked onto the clock signal. However, it is to be appreciated that the present disclosure is not limited to this example.

Figure 5:
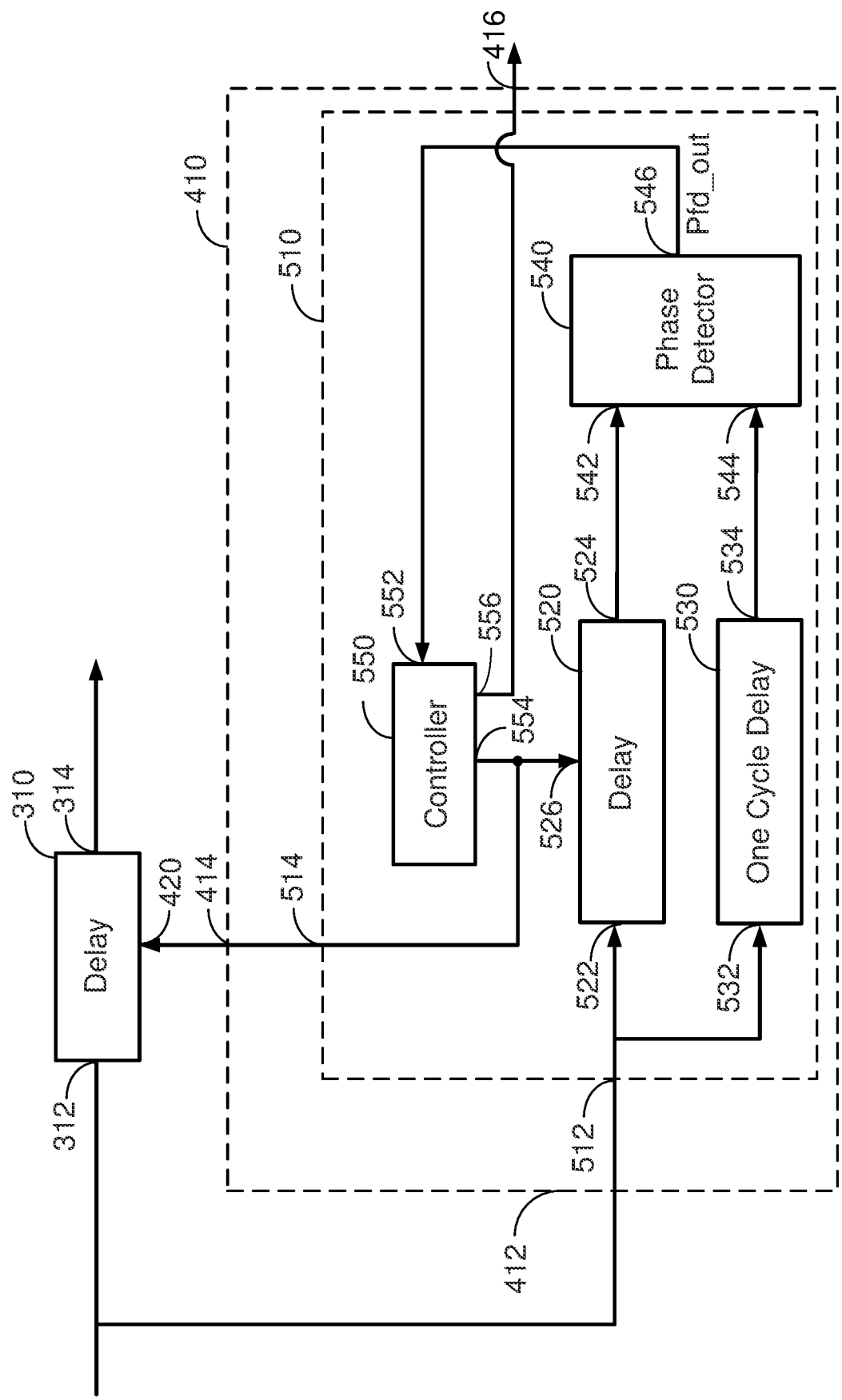
FIG. 5 shows an example of a delay-locked loop (DLL) according to certain aspects of the present disclosure.

In certain aspects, the delay control circuit 410 may be implemented with a delay-locked loop (DLL). In this regard, FIG. 5 shows an example in which the delay control circuit 410 includes a DLL 510 according to certain aspects. In this example, the DLL 510 has an input 512 coupled to the input 312 of the delay circuit 310, and an output 514 coupled to the control input 420 of the delay circuit 310.

The DLL 510 includes a delay circuit 520, a one cycle delay circuit 530, a phase detector 540 (also referred to as phase frequency detector), and a controller 550. In certain aspects, the delay circuit 520 may include delay buffers coupled in series. However, it is to be appreciated that the present disclosure is not limited to this example. The delay circuit 520 has an input 522 and an output 524. The input 522 of the delay circuit 520 is coupled to the input 512 of the DLL 510. The delay circuit 520 is configured to receive the clock signal at the input 522, delay the clock signal by a tunable delay, and output the delayed clock signal at the output 524. The delay circuit 520 also has a control input 526 configured to receive a delay control signal from the controller 550. As discussed further below, the tunable delay of the delay circuit 520 is controlled by the delay control signal from the controller 550.

The one cycle delay circuit 530 has an input 532 and an output 534. The input 532 of the one cycle delay circuit 530 is coupled to the input 512 of the DLL 510. The one cycle delay circuit 530 is configured to receive the clock signal at the input 532, delay the clock signal by one cycle (i.e., one period) of the clock signal, and output the one cycle delayed clock signal at the output 534. For example, the one cycle delay circuit 530 may include a latch (e.g., flip flop) that is clocked by the clock signal.

The phase detector 540 has a first input 542 coupled to the output 524 of the delay circuit 520, a second input 544 coupled to the output 534 of the one cycle delay circuit 530, and an output 546. The phase detector 540 is configured to compare the phases of the delayed clock signal from the delay circuit 520 and the one cycle delayed clock signal, and output an output signal (labeled "Pfd_out") indicating the phase difference (i.e., phase error) between the delayed clock signal from the delay circuit 520 and the one cycle delayed clock signal. The phase detector 540 may be implemented with a bang-bang phase detector or another type of phase detector.

The controller 550 has an input 552 coupled to the output 546 of the phase detector 540, and an output 554 coupled to the control input 526 of the delay circuit 520. The controller 550 is configured to receive the output signal from the phase detector 540 at the input 552, generate a delay control signal based on the received output signal, and output the delay control signal to the delay circuit 520 via the output 554. In certain aspects, the controller 550 is configured to tune (i.e., adjust) the delay of the delay circuit 520 using the delay control signal until the phase difference between the delayed clock signal from the delay circuit 520 and the one cycle delayed clock signal is approximately zero. When the phase difference (i.e., phase error) is approximately zero, the delay of the delay circuit 520 is approximately equal to one cycle (i.e., one period) of the clock signal. Thus, in this example, the DLL 510 locks when the delay of the delay circuit 520 is approximately equal to one cycle (i.e., one period) of the clock signal.

The delay control signal generated by the controller 550 may also be sent to the delay circuit 310 to control the delay of the delay circuit 310, as shown in FIG. 5. In this example, the delay circuit 310 is configured to receive the delay control signal from the controller 550 via the control input 420, and set the delay of the delay circuit 310 based on the delay control signal. Thus, in this example, the delay of the delay circuit 310 is controlled by the delay control signal generated by the DLL 510. In this example, the delay circuit 310 may be configured such that the delay control signal from the DLL 510 sets the delay of the delay circuit 310 to a desired fraction of one clock cycle when the DLL 510 is locked.

In certain aspects, the controller 550 may have a status output 556 coupled to the status output 416 of the delay control circuit 410. In one example, the controller 550 may output a status signal via the status output 556 indicating when the DLL 510 is locked onto a clock signal (e.g., the first clock signal and the second clock signal). In this example, the controller 550 may determine that the DLL 510 is locked when the phase difference output by the phase detector 540 is close to or approximately zero. However, it is to be appreciated that the present disclosure is not limited to this example.

It is to be appreciated that the DLL 510 is not limited to the example shown in FIG. 5. For example, the one cycle delay circuit 530 may be omitted in some implementations. In this example, the second input 544 of the phase detector 540 is coupled to the input 512 of the DLL 510 without the one cycle delay circuit 530. Thus, the second input 544 of the phase detector 540 may be coupled to the input 512 of the DLL 510 via the one cycle delay circuit 530 or not. In implementations where the one cycle delay circuit 530 is omitted, the DLL 510 may still lock when the delay of the delay circuit 520 is approximately equal to one cycle of the clock signal since the clock signal is periodic (e.g., rising edges of the clock signal are spaced one cycle apart).

Figure 6:
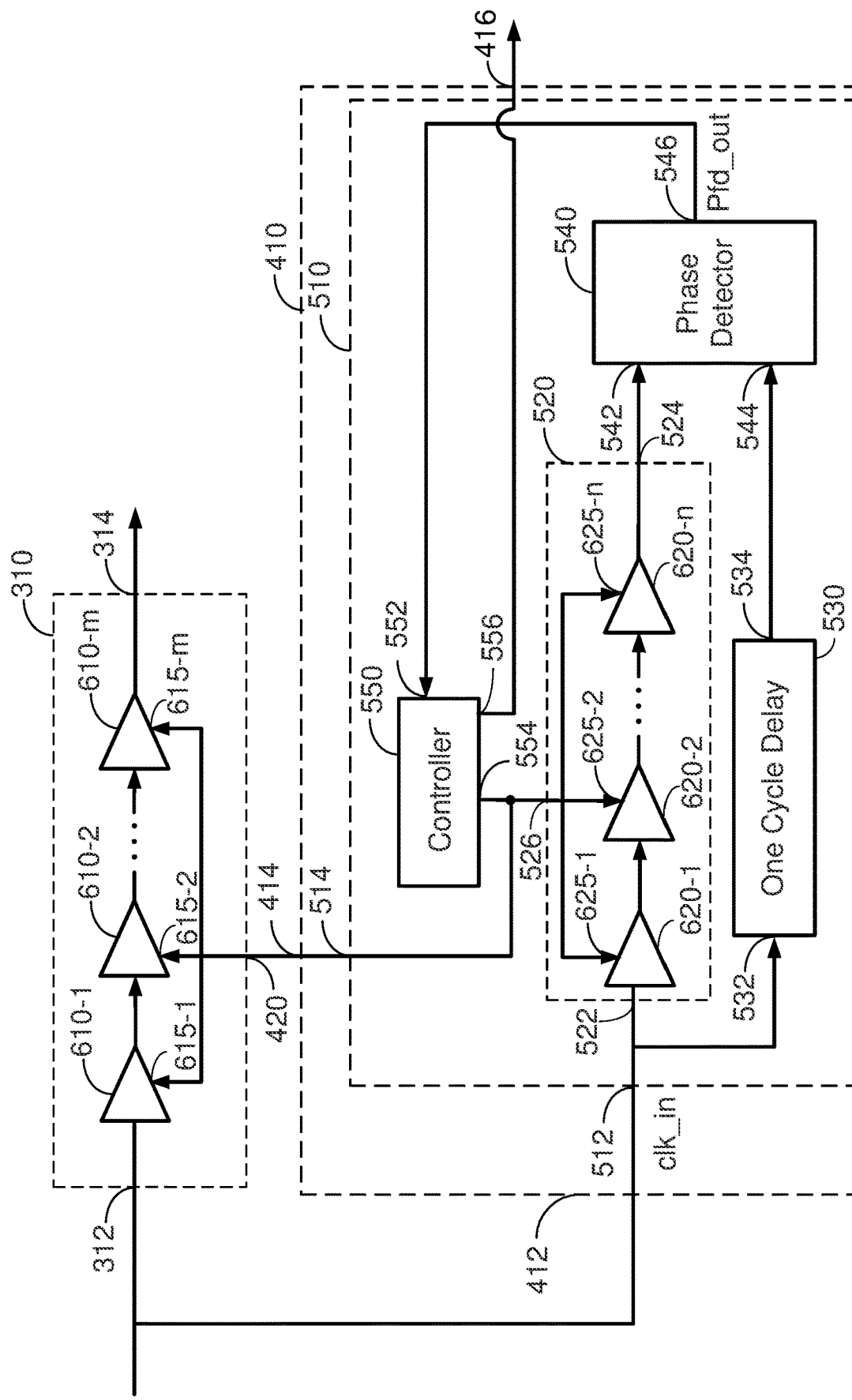
FIG. 6 shows an example of a delay circuit including delay buffers coupled in series according to certain aspects of the present disclosure.

In certain aspects, each of the delay circuit 310 and the delay circuit 520 may include respective delay buffers coupled in series. In this regard, FIG. 6 shows an example in which the delay circuit 310 includes delay buffers 610-1 to 610-$m$ coupled in series. Each of the delay buffers 610 to 610-$m$ has a respective control input 615-1 to 615-$m$ coupled to the control input 420 of the delay circuit 310. In this example, the delay of the delay circuit 310 may be approximately equal to the sum of the delays of the delay buffers 610-1 to 610-$m$ where the delay of each of the delay buffers 610-1 to 610-$m$ may be controlled by the delay control signal from the DLL 510. The delay control signal may include a bias current, a bias voltage, a digital delay code, or any combination thereof. For the example of a bias current, the delays of the delay buffers 610-1 to 610-$m$ may decrease when the controller 550 increases the bias current. In this example, the decrease in the delays may be due to an increase in the drive strengths of the delay buffers caused by the increased bias current. Thus, in this example, the controller 550 may decrease the delay of the delay circuit 310 by increasing the bias current, and increase the delay of the delay circuit 310 by decreasing the bias current. However, it is to be appreciated that the present disclosure is not limited to this example.

FIG. 6 also shows an example in which the delay circuit 520 in the DLL 510 includes delay buffers 620-1 to 620-$n$ coupled in series. Each of the delay buffers 620 to 620-$n$ has a respective control input 625-1 to 625-$n$ coupled to the control input 526 of the delay circuit 520. In this example, the delay of the delay circuit 520 may be approximately equal to the sum of the delays of the delay buffers 620-1 to 620-$n$ where the delay of each of the delay buffers 620-1 to 620-$n$ may be controlled by the delay control signal from the controller 550. As discussed above, the delay control signal may include a bias current, a bias voltage, a digital delay code, or any combination thereof.

In this example, the controller 550 tunes the delay control signal until the delay of the delay circuit 520 is approximately equal to one cycle (i.e., one period) of the clock signal, as discussed above. When this occurs, the delay of each of the delay buffers 620-1 to 620-$n$ in the delay circuit 520 may be approximately equal to 1/n of one cycle of the clock signal where n is the number of delay buffers 620-1 to 620-$n$ in the delay circuit 520. In this example, the delay control signal may cause the delay of the delay circuit 310 to be approximately equal to m/n of one cycle of the clock signal where m is the number of delay buffers 610-1 to 610-$m$ in the delay circuit 310. Therefore, in this example, the delay of the delay circuit 310 may be set to a desired fraction of one cycle of the clock signal by setting the ratio of n and m accordingly. However, it is to be appreciated that the present disclosure is not limited to this example, and that the delay of the delay circuit 310 may be set to a desired fraction of one cycle of the clock signal when the DLL 510 is locked using other techniques.

As discussed above, the delays of the delay buffers 610-1 to 610-$m$ and 620-1 to 620-$n$ may be controlled by a bias current and/or a bias voltage. In one example, the delay control signal from the controller 550 may include the bias current and/or the bias voltage. In another example shown in FIG. 7, the delay circuit 310 includes a bias circuit 710 configured to receive the delay control signal from the controller 550, and generate the corresponding bias current and/or bias voltage for the delay buffers 610-1 to 610-$m$. In this example, the bias circuit 710 has an input 712 coupled to the control input 420, and an output 714 coupled to the control inputs 615-1 to 615-$m$ of the delay buffers 610-1 to 610-$m$. In this example, the bias circuit 710 receives the delay control signal from the controller 550 at the input 712, in which the delay control signal may include a digital delay code. The bias circuit 710 may then generate the bias current and/or the bias voltage based on the delay code, and output the bias current and/or the bias voltage to the delay buffers 610-1 to 610-$m$ via the output 714.

Figure 7:
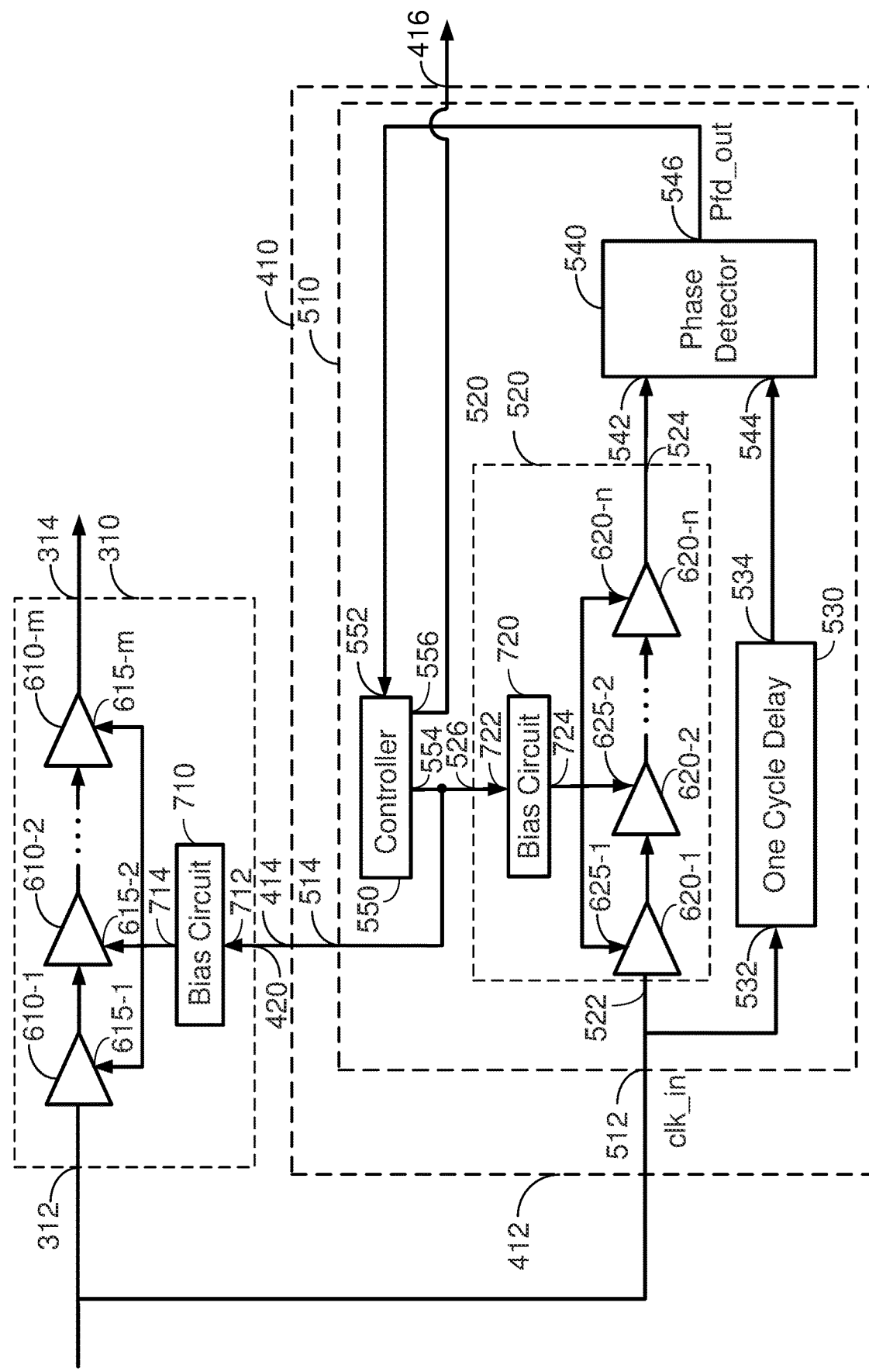
FIG. 7 shows an example of a bias circuit configured to bias delay buffers in a delay circuit according to certain aspects of the present disclosure.

FIG. 7 also shows an example in which the delay circuit 520 includes a bias circuit 720 configured to receive the delay control signal from the controller 550, and generate the corresponding bias current and/or bias voltage for the delay buffers 620-1 to 620-$n$. In this example, the bias circuit 720 has an input 722 coupled to the control input 526, and an output 724 coupled to the control inputs 625-1 to 625-$n$ of the delay buffers 620-1 to 620-$n$. In this example, the bias circuit 720 receives the delay control signal at the input 722, which may include the delay code. The bias circuit 720 may then generate the bias current and/or the bias voltage based on the delay code, and output the bias current and/or bias voltage to the delay buffers 620-1 to 620-$n$ via the output 724. In this example, the controller 550 tunes (i.e., adjusts) the delay of the delay circuit 520 by changing the delay code, which the bias circuit 720 converts into the corresponding current bias and/or bias voltage.

A challenge with using the delay control circuit 410 to control the delay of the delay circuit 310 is that it takes time for the delay control circuit 410 to set the delay of the delay circuit 310 (e.g., to a desired fraction of one clock cycle) when the delay control circuit 410 first receives a clock signal in the clock path 120. For example, when the delay control circuit 410 includes the DLL 510, it may take time for the DLL 510 to lock onto the clock signal in the clock path 120 to set the delay of the delay circuit 310. As a result, when the multiplexer 230 switches the clock path 120 between the first clock signal and the second clock signal, it takes time for the delay control circuit 410 to reset the delay of the delay circuit 310 (e.g., the DLL 510 to relock). The time needed for the delay control circuit 410 to reset the delay of the delay circuit 310 (e.g., the time needed for the DLL 510 to relock) creates a time latency in the clock switching (i.e., increases the time needed to switch between the clock signals). For the example where the clock signal in the clock path 120 is used to facilitate data transfer, the time latency in the clock switching causes an interruption in the data traffic flow.

To address the above, aspects of the present disclosure reduce the clock switching latency using parallel clock paths with respective delay control circuits, alternating between the parallel clock paths to switch clock sources, and alternating between the respective delay control circuits to switch the delay control signal input to the delay circuit, as discussed further below.

Figure 8:
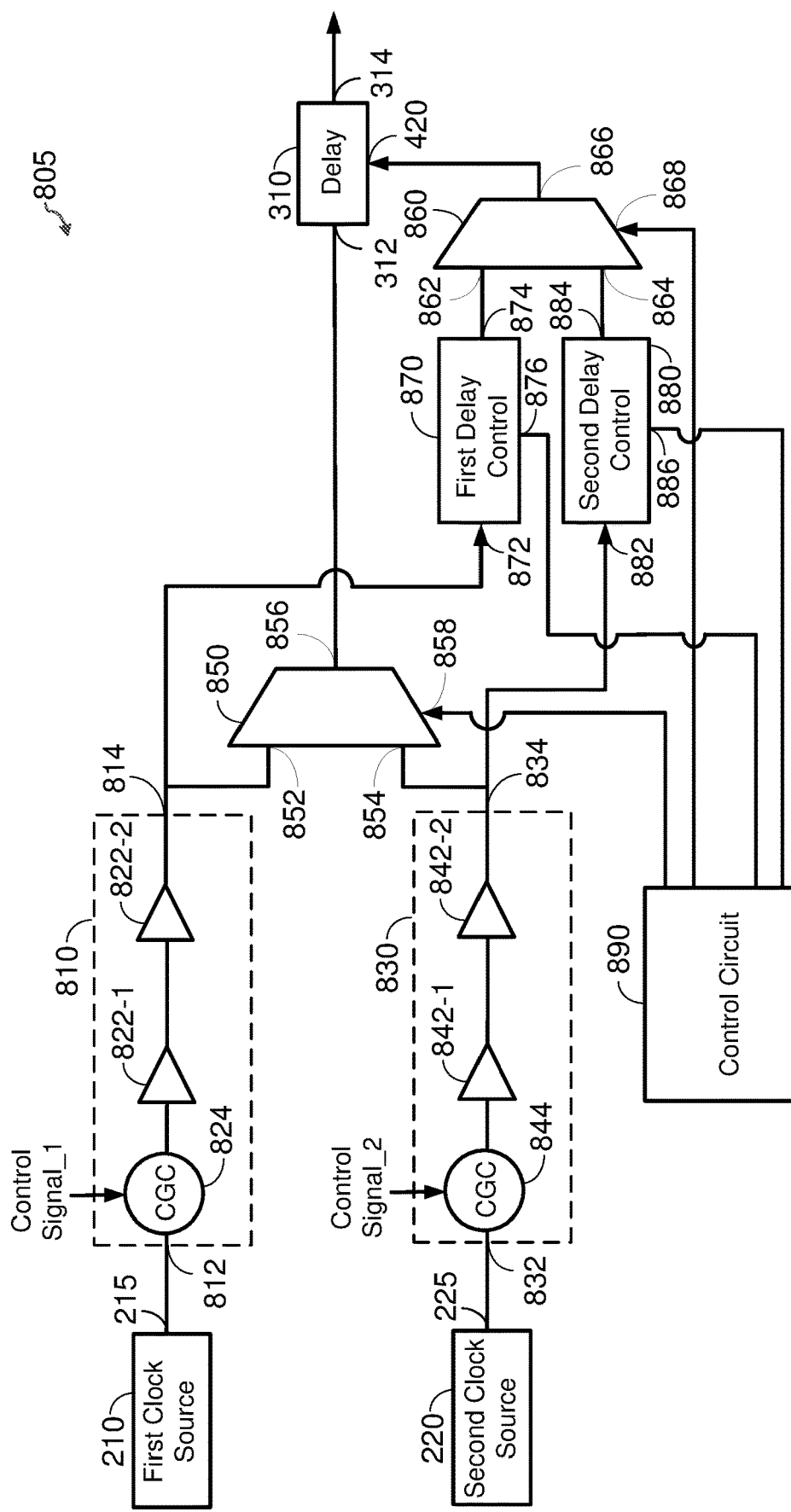
FIG. 8 shows an example of a system including parallel clock paths according to certain aspects of the present disclosure.

FIG. 8 shows an example of a system 805 including a first clock path 810 and a second clock path 830 according to certain aspects. The system 805 also includes the first clock source 210 and the second clock source 220 discussed above. In this example, the first clock path 810 has an input 812 coupled to the output 215 of the first clock source 210, and an output 814. Thus, the first clock signal from the first clock source 210 propagates through the first clock path 810. Also, in this example, the second clock path 830 has an input 832 coupled to the output 225 of the second clock source 220, and an output 834. Thus, the second clock signal from the second clock source 220 propagates through the second clock path 830.

In the example shown in FIG. 8, the first clock path 810 includes respective clock buffers 822-1 and 822-2, and a respective clock gating circuit 824. Also, the second clock path 830 includes respective buffers 842-1 and 842-2, and a respective clock gating circuit 844. It is to be appreciated that each of the clock paths 810 and 830 may have a different number of clock buffers than shown in the example in FIG. 8. For example, the number of clock buffers in each of the clock paths 810 and 830 may depend on, the length of the clock path, the drive strengths of the clock buffers in the clock path, the load coupled to the clock path, etc. The clock buffers 822-1 and 822-2 may also be referred to as first clock buffers and the clock buffers 842-1 and 842-2 may also be referred to as second clock buffers.

The system 805 also includes the delay circuit 310, a first delay control circuit 870, a second delay control circuit 880, a first multiplexer 850, and a second multiplexer 860. In certain aspects, each of the first delay control circuit 870 and the second delay control circuit 880 may be DLL based (i.e., include a respective DLL to generate a respective delay control signal). For example, each of the first delay control circuit 870 may include a first instance (i.e., copy) of the exemplary DLL 510 discussed above, and the second delay control circuit 880 may include a second instance (i.e., copy) of the exemplary DLL 510 discussed above according to certain aspects. However, it is to be appreciated that the first delay control circuit 870 and the second delay control circuit 880 are not limited to this example.

The first multiplexer 850 has a first input 852, a second input 854, a select input 858, and an output 856. The first input 852 is coupled to the output 814 of the first clock path 810, the second input 854 is coupled to the output 834 of the second clock path 830, and the output 856 is coupled to the input 312 of the delay circuit 310. The output 314 of the delay circuit 310 may be coupled to the clock transmitter 320 (shown in FIGS. 3 and 4) or another circuit. The first multiplexer 850 is configured to select one of the first input 852 and the second input 854 based on a select signal received at the select input 858, and couple the selected one of the first input 852 and the second input 854 to the output 856. Thus, the first multiplexer 850 selectively couples the first clock path 810 or the second clock path 830 to the input 312 of the delay circuit 310 based on the select signal. In the example shown in FIG. 8, the select input 858 is coupled to a control circuit 890 configured to generate the select signal to control the first multiplexer 850.

The first delay control circuit 870 (e.g., the first instance of the DLL 510) has an input 872 and an output 874. The input 872 is coupled to the output 814 of the first clock path 810, and thus receives the first clock signal propagating through the first clock path 810. The first delay control circuit 870 is configured to use the first clock signal from the first clock path 810 as a timing reference to generate a first delay control signal, and output the first delay control signal at the output 874. For example, the first delay control signal may set the delay of the delay circuit 310 to a desired fraction of one cycle of the first clock signal. In certain aspects, the first delay control circuit 870 may send a status signal to the control circuit 890 via a status output 876 indicating when the first delay control circuit 870 is locked. For the example in which the first delay control circuit 870 includes the first instance of the DLL 510, the respective controller 550 may send the status signal when the phase difference output by the respective phase detector 540 is close to or approximately zero.

The second delay control circuit 880 (e.g., the second instance of the DLL 510) has an input 882 and an output 884. The input 882 is coupled to the output 834 of the second clock path 830, and thus receives the second clock signal propagating through the second clock path 830. The second delay control circuit 880 is configured to use the second clock signal from the second clock path 830 as a timing reference to generate a second delay control signal, and output the second delay control signal at the output 884. For example, the second delay control signal may set the delay of the delay circuit 310 to a desired fraction of one cycle of the second clock signal. In certain aspects, the second delay control circuit 880 may send a status signal to the control circuit 890 via a status output 886 indicating when the second delay control circuit 880 is locked. For the example in which the second delay control circuit 880 includes the second instance of the DLL 510, the respective controller 550 may send the status signal when the phase difference output by the respective phase detector 540 is close to or approximately zero.

Since the first clock signal and the second clock signal may have different clock frequencies, one cycle of the first clock signal may be different from one cycle of the second clock signal. As a result, the first delay control signal output by the first delay control circuit 870 may be different from the second delay control signal output by the second delay control circuit 880.

The second multiplexer 860 has a first input 862, a second input 864, a select input 868, and an output 866. The first input 862 is coupled to the output 874 of the first delay control circuit 870, the second input 864 is coupled to the output 884 of the second delay control circuit 880, and the output 866 is coupled to the control input 420 of the delay circuit 310. The second multiplexer 860 is configured to select one of the first input 862 and the second input 864 based on a select signal received at the select input 868, and couple the selected one of the first input 862 and the second input 864 to the output 866. Thus, the second multiplexer 860 selectively couples the first delay control circuit 870 or the second delay control circuit 880 to the control input 420 of the delay circuit 310 based on the select signal. In the example shown in FIG. 8, the select input 868 is coupled to the control circuit 890, which is configured to generate the select signal to control the second multiplexer 860. The select signal for the first multiplexer 850 and the select signal for the second multiplexer 860 may be the same or different.

Exemplary operations of the system 805 will now be discussed according to certain aspects.

In a first mode, the first clock source 210 is selected. In the first mode, the control circuit 890 causes the first multiplexer 850 to select the first clock path 810 (i.e., select the first input 852) and causes the second multiplexer 860 to select the first delay control circuit 870 (i.e., select the first input 862). As a result, the first multiplexer 850 couples the first clock path 810 to the input 312 of the delay circuit 310, and the second multiplexer 860 couples the first delay control circuit 870 to the control input 420 of the delay circuit 310. Thus, the delay circuit 310 receives the first clock signal from the first clock path 810, and delays the first clock signal, in which the delay of the delay circuit 310 is controlled by the first delay control circuit 870. The first delay control circuit 870 may set the delay of the delay circuit 310 to a desired fraction of one cycle of the first clock signal using the first delay control signal.

In a second mode, the second clock source 220 is selected. In the second mode, the control circuit 890 causes the first multiplexer 850 to select the second clock path 830 (i.e., select the second input 854) and causes the second multiplexer 860 to select the second delay control circuit 880 (i.e., select the second input 864). As a result, the first multiplexer 850 couples the second clock path 830 to the input 312 of the delay circuit 310, and the second multiplexer 860 couples the second delay control circuit 880 to the control input 420 of the delay circuit 310. Thus, the delay circuit 310 receives the second clock signal from the second clock path 830, and delays the second clock signal, in which the delay of the delay circuit 310 is controlled by the second delay control circuit 880. For example, the second delay control circuit 880 may set the delay of the delay circuit 310 to a desired fraction of one cycle of the second clock signal using the second delay control signal.

In certain aspects, the fraction used for the first clock signal may be referred to as a first fraction and the fraction used for the second clock signal may be referred to as a second fraction. In some implementations, the first fraction and the second fraction may be equal (e.g., to maintain the same phase relationship between the data signal and the clock signal at the output 314 of the delay circuit 310 across different clock frequencies). In other implementations, the first fraction and the second fraction may be different. In this example, the first delay control signal from the first delay control circuit 870 sets the delay 310 of the delay circuit to a first delay equal to the first fraction of a cycle of the first clock signal, and the second delay control signal from the second delay control circuit 880 sets the delay of the delay circuit 310 to a second delay equal to the second fraction of a cycle of the second clock signal. It is to be appreciated that the first delay and the second delay may be different even when the first fraction and the second fraction are equal since one cycle of the first clock signal may be different from one cycle of the second clock signal (e.g., due to the first and second clock signals having different frequencies).

The control circuit 890 may switch the delay circuit 310 from the first clock source 210 to the second clock source 220 (i.e., switch from the first mode to the second mode) as follows. Before the clock sources are switched, the second delay control circuit 880 receives the second clock signal from the second clock source 220 via the second clock path 830, and locks onto the second clock signal to generate the second delay control signal. After the second delay control circuit 880 is locked, the second delay control circuit 880 may send a status signal to the control circuit 890 via the status output 886 to proceed with the clock switch (e.g., a status signal indicating the second delay control circuit 880 is locked). In response, the control circuit 890 causes the first multiplexer 850 to switch from the first clock path 810 to the second clock path 830, and at a same time causes the second multiplexer 860 to switch from the first delay control circuit 870 to the second delay control circuit 880. Because the second delay control circuit 880 is already locked onto the second clock signal from the second clock source 220, the clock switching is not affected by the locking latency of the second delay control circuit 880. In other words, the second delay control circuit 880 locks onto the second clock signal before the clock switching so that the locking latency does not impact the clock switching.

In some implementations, instead of receiving the status signal from the second delay control circuit 880, the control circuit 890 may assume that the second delay control circuit 880 is locked onto the second clock signal after a certain period of time has elapsed from the time the second delay control circuit 880 receives the second clock signal. In these implementations, the control circuit 890 may proceed with the clock switch after the period of time has elapsed.

The control circuit 890 may switch the delay circuit 310 from the second clock source 220 to the first clock source 210 (i.e., switch from the second mode to the first mode) as follows. Before the clock sources are switched, the first delay control circuit 870 receives the first clock signal from the first clock source 210 via the first clock path 810, and locks onto the first clock signal to generate the first delay control signal. After the first delay control circuit 870 is locked, the first delay control circuit 870 may send a status signal to the control circuit 890 via the status output 886 to proceed with the clock switch (e.g., a status signal indicating the first delay control circuit 870 is locked). In response, the control circuit 890 causes the first multiplexer 850 to switch from the second clock path 830 to the first clock path 810, and at a same time causes the second multiplexer 860 to switch from the second delay control circuit 880 to the first delay control circuit 870. Because the first delay control circuit 870 is already locked onto the first clock signal from the first clock source 210, the clock switching is not affected by the locking latency of the first delay control circuit 870.

In some implementations, instead of receiving the status signal from the first delay control circuit 870, the control circuit 890 may assume that the first delay control circuit 870 is locked onto the first clock signal after a certain period of time has elapsed from the time the first delay control circuit 870 receives the first clock signal. In these implementations, the control circuit 890 may proceed with the clock switch after the period of time has elapsed.

Thus, aspects of the present disclosure reduce clock switching latency by eliminating or reducing the impact of locking latency (e.g., DLL locking latency) on the clock switching latency. For the example where the system 805 is used to facilitate data transfer, the reduced clock switching latency reduces the duration that the data traffic flow is interrupted during a clock switch. In this example, the data traffic may be briefly interrupted during the switch between the clock paths 810 and 820 by the first multiplexer 850. However, the overall clock switching latency (i.e., the latency to switch clock signals) is reduced by eliminating or reducing the impact of locking latency (e.g., DLL locking latency) on the clock switching latency.

In certain aspects, the control circuit 890 may also control the clock gating circuit 824 in the first clock path 810 using a first control signal and control the clock gating circuit 844 in the second clock path 830 using a second control signal. In one example, the control circuit 890 may cause the clock gating circuit 844 in the second clock path 830 to gate the second clock signal from the second clock source 220 when the first multiplexer 850 selects the first clock path 810. Before switching from the first clock source 210 to the second clock source 220, the control circuit 890 may cause the clock gating circuit 844 to pass (i.e., un-gate) the second clock signal during a time period before the switch to give the second delay control circuit 880 time to lock onto the second clock signal in preparation for the switch. During this time period the first delay control circuit 870 may generate the first delay control signal and the second delay control circuit 880 may generate the second delay control signal simultaneously.

Also, in this example, the control circuit 890 may cause the clock gating circuit 824 in the first clock path 810 to gate the first clock signal from the first clock source 210 when the first multiplexer 850 selects the second clock path 830. Before switching from the second clock source 220 to the first clock source 210, the control circuit 890 may cause the clock gating circuit 824 to pass (i.e., un-gate) the first clock signal during a time period before the switch to give the first delay control circuit 870 time to lock onto the first clock signal in preparation for the switch. During this time period the first delay control circuit 870 may generate the first delay control signal and the second delay control circuit 880 may generate the second delay control signal simultaneously.

Within this disclosure, it is to be appreciated that an input may include two or more parallel inputs, and an output may include two or more parallel outputs. For example, the output 874 of the first delay control circuit 870 may include two or more parallel outputs in implementations where the first delay control signal includes two or more parallel signals (e.g., a delay code including multiple bits sent in parallel, or any combination of two or more of a bias current, a bias voltage, and a delay code). Similarly, the output 884 of the second delay control circuit 880 may include two or more parallel outputs. In this example, the first input 862 and the second input 864 of the second multiplexer 860 may each include two or more parallel inputs, the output 866 of the second multiplexer 860 may include two or more parallel outputs, and the control input 420 of the delay circuit 310 may include two or more parallel inputs.

Figure 9:
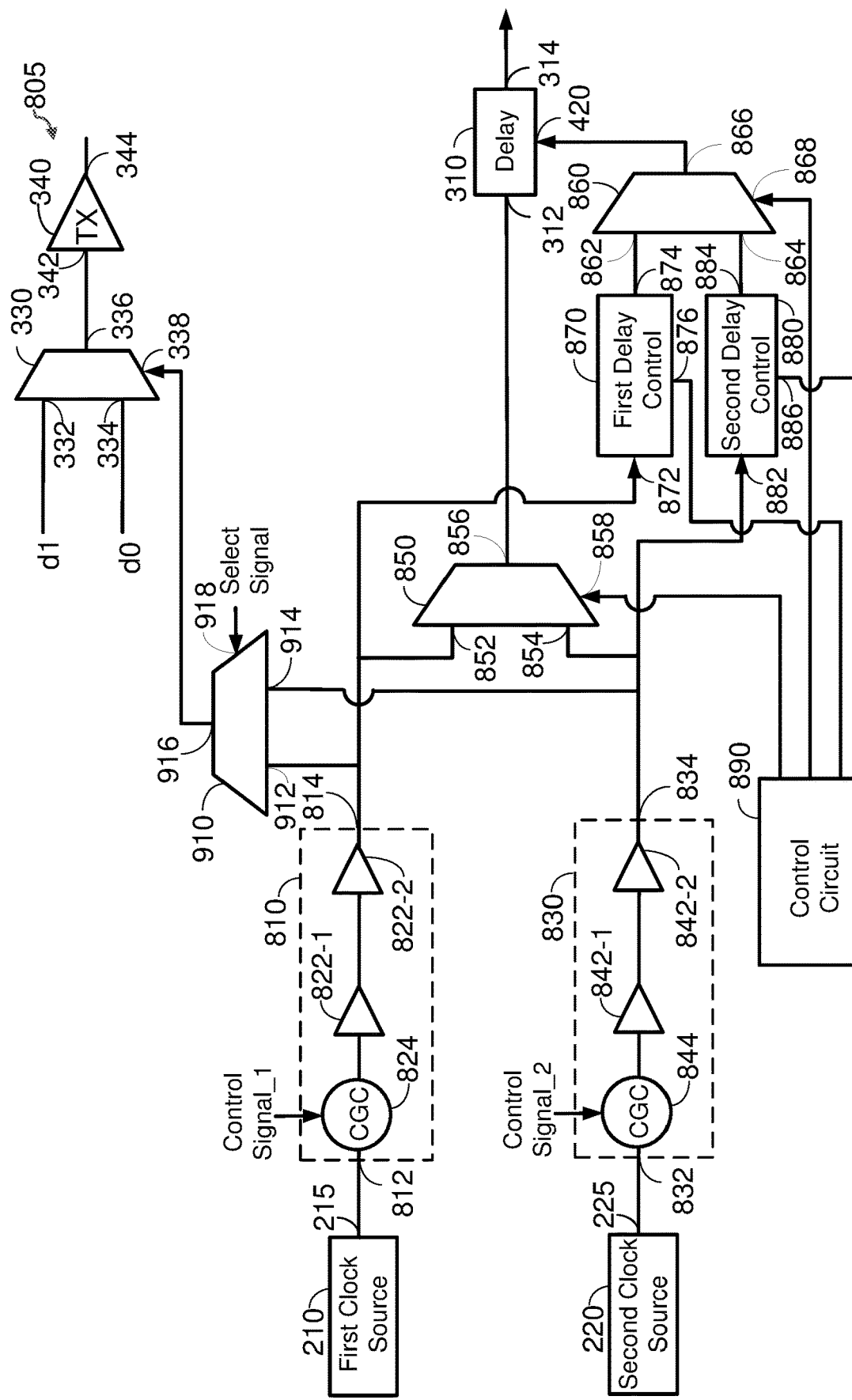
FIG. 9 shows an example in which parallel clock paths facilitate data transfer according to certain aspects of the present disclosure.

The exemplary system 805 may be used, for example, to facilitate the transfer of data (e.g., from a first chip including the system 805 to a second chip). In this regard, FIG. 9 shows an example in which the system 805 also includes the data multiplexer 330 and the data transmitter 340 discussed above with reference to FIG. 3. As discussed above, the data multiplexer 330 combines the first data signal d0 and the second data signal d1 into a DDR data signal, and the data transmitter 340 transmits the DDR data signal.

In this example, the system 805 further includes a third multiplexer 910. The third multiplexer 910 has a first input 912 coupled to the first clock path 810, a second input 914 coupled to the second clock path 830, an output 916 coupled to the select input 338 of the data multiplexer 330, and a select input 918. In one example, the select input 918 receives a select signal from the control circuit 890 to control the third multiplexer 910. In this example, the third multiplexer 910 couples the first clock path 810 or the second clock path 830 to the select input 338 of the data multiplexer 330 based on the select signal.

When the first clock source 210 is selected, the control circuit 890 causes the third multiplexer 910 to couple the first clock path 810 to the select input 338 of the data multiplexer 330. As a result, the first clock signal from the first clock source 210 times the operations of the data multiplexer 330 to generate the DDR data signal. The control circuit 890 also causes the first multiplexer 850 to couple the first clock path 810 to the input 312 of the delay circuit 310, and causes the second multiplexer 860 to couple the first delay control circuit 870 to the control input 420 of the delay circuit 310, as discussed above.

When the second clock source 220 is selected, the control circuit 890 causes the third multiplexer 910 to couple the second clock path 830 to the select input 338 of the data multiplexer 330. As a result, the second clock signal from the second clock source 220 times the operations of the data multiplexer 330 to generate the DDR data signal. The control circuit 890 also causes the first multiplexer 850 to couple the second clock path 830 to the input 312 of the delay circuit 310, and causes the second multiplexer 860 to couple the second delay control circuit 880 to the control input 420 of the delay circuit 310, as discussed above.

It is to be appreciated that the system 805 may include one or more additional components not shown in FIG. 9. For example, the system 805 may include additional clock buffers in addition to the clock buffers 822-1, 822-2, 844-1, and 844-2 shown in the example in FIG. 9. For example, the system 805 may include one or more clock buffers (not shown) in the path between the third multiplexer 910 and the data multiplexer 330. Therefore, it is to be appreciated that one or more additional components may be placed in the various paths shown in the example in FIG. 9. Also, the output 916 of the third multiplexer 910 may also be coupled to logic (not shown) that generates the first data signal d0 and the second data signal d1 so that the logic may time the generation of the first data signal d0 and the second data signal d1 using the selected clock signal. In some implementations, the third multiplexer 910 may be omitted and the select input 338 of the data multiplexer 338 may be coupled to the output 856 of the first multiplexer 850.

Figure 10:
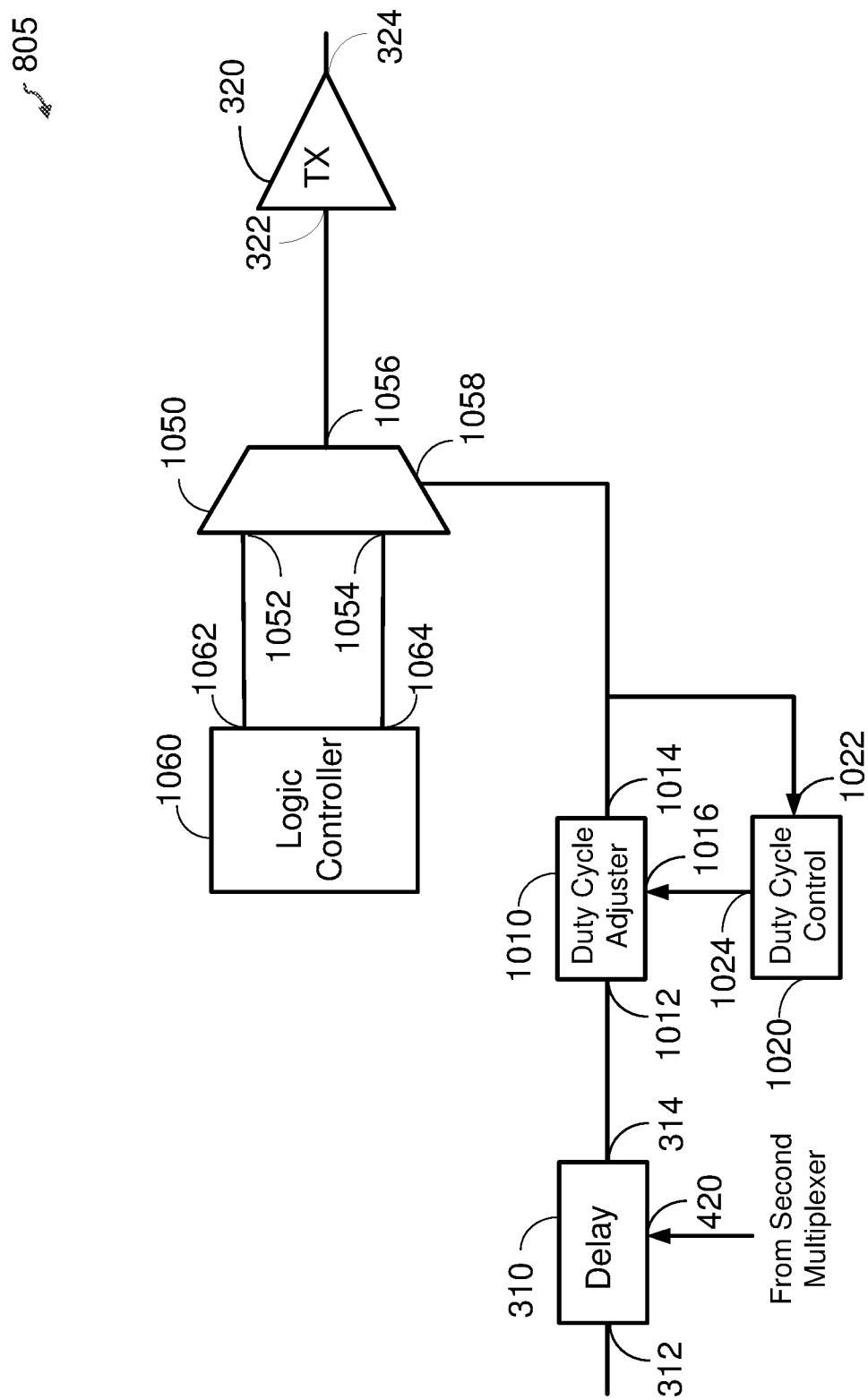
FIG. 10 shows an example of a clock path including a duty cycle adjuster according to certain aspects of the present disclosure.

As discussed above, the delay circuit 310 may be coupled to the clock transmitter 320 in certain aspects. In this regard, FIG. 10 shows an example in which the output 314 of the delay circuit 310 is coupled to the input 322 of the clock transmitter 320. FIG. 10 also shows an example of additional components that may be placed in the clock path between the output 314 of the delay circuit 310 and the input 322 of the clock transmitter 320.

In the example shown in FIG. 10, the system 805 also includes a duty cycle adjuster 1010 and a duty cycle control circuit 1020. The duty cycle adjuster 1010 has an input 1012 coupled to the output 314 of the delay circuit 310, an output 1014, and a control input 1016. The duty cycle control circuit 1020 has an input 1022 coupled to the output 1014 of the duty cycle adjuster 1010, and an output 1024 coupled to the control input 1016 of the duty cycle adjuster 1010. The duty cycle adjuster 1010 is configured to receive a clock signal at the input 1012, adjust the duty cycle of the clock signal based on a control signal received at the control input 1016 from the duty cycle control circuit 1020, and output the clock signal after the duty cycle adjustment at the output 1014. In this disclosure, the duty cycle of the clock signal may be expressed as a fraction or a percentage of a clock cycle (i.e., clock period) in which the clock signal is high (i.e., logic one).

The duty cycle control circuit 1020 is configured to measure the duty cycle of the clock signal and cause the duty cycle adjuster 1010 to adjust the duty cycle of the clock signal based on the measured duty cycle to achieve a target duty cycle. For an example of a DDR system, the target duty cycle may be 0.5 so that rising and falling edges of the clock signal are evenly spaced apart. In this example, the duty cycle control circuit 1020 may cause the duty cycle adjuster 1010 to decrease the duty cycle of the clock signal if the measured duty cycle is greater than 0.5, and cause the duty cycle adjuster 1010 to increase the duty cycle of the clock signal if the measured duty cycle is less than 0.5. The duty cycle of the clock signal at the input 1012 of the duty cycle adjuster 1010 may differ from the target duty cycle due to, for example, duty cycle distortion caused by one or more components in the system 805. In this case, the duty cycle adjuster 1010 corrects for (i.e., undoes) the duty cycle distortion.

In the example in FIG. 10, the system 805 also includes a multiplexer 1050 and a logic controller 1060 according to certain aspects. In this example, the multiplexer 1050 is used to mimic the effect of the data multiplexer 330 on the timing of the DDR data signal so that the effect of the multiplexer 1050 on the timing of the clock signal is similar. This is done to reduce the timing difference between the DDR data signal and the clock signal caused by the data multiplexer 330.

In this example, the multiplexer 1050 has a first input 1052, a second input 1054, a select input 1058, and an output 1056. The select input 1058 is coupled to the output 1014 of the duty cycle adjuster 1010, and therefore receives the clock signal. The multiplexer 1050 is configured to select the first input 1052 when the clock signal is high (i.e., logic one) and select the second input 1054 when the clock signal is low (i.e., logic zero). Thus, the clock signal causes the multiplexer 1050 to alternate between the first input 1052 and the second input 1054. The output 1056 of the multiplexer 1050 is coupled to the input 322 of the clock transmitter 320.

The logic controller 1060 has a first output 1062 coupled to the first input 1052 of the multiplexer 1050, and a second output 1064 coupled to the second input 1054 of the multiplexer 1050. The logic controller 1060 is configured to control the logic value at the first input 1052 of the multiplexer 1050 via the first output 1062, and control the logic value at the second input 1054 of the multiplexer 1050 via the second output 1064. To propagate the clock signal to the clock transmitter 320, the logic controller 1060 may input a logic one to the first input 1052 of the multiplexer 1050, and input a logic zero to the second input 1054 of the multiplexer 1050. This causes the output 1056 of the multiplexer 1050 to alternate between one (i.e., high) and zero (i.e., low) at the frequency of the clock signal at the select input 1058 of the multiplexer 1050, thereby reforming the clock signal at the output 1056 of the multiplexer 1050. In certain aspects, the multiplexer 1050 has the same or substantially the same structure as the data multiplexer 330 so that the multiplexer 1050 affects the timing of the clock signal in a similar manner as the data multiplexer 330 affects the timing of the DDR data signal. This reduces the timing difference between the DDR data signal and the clock signal caused by the data multiplexer 330. The logic controller 1060 may disable the multiplexer 1050 by inputting the same logic value to the inputs 1052 and 1054 of the multiplexer 1050.

It is to be appreciated that, the duty cycle adjuster 1010 or the multiplexer 1050 may be omitted in some implementations. It is also to be appreciated that the multiplexer 1050 may be located before the duty cycle adjuster 1010 in the clock path between the delay circuit 310 and the clock transmitter 320 in some implementations.

Figure 11:
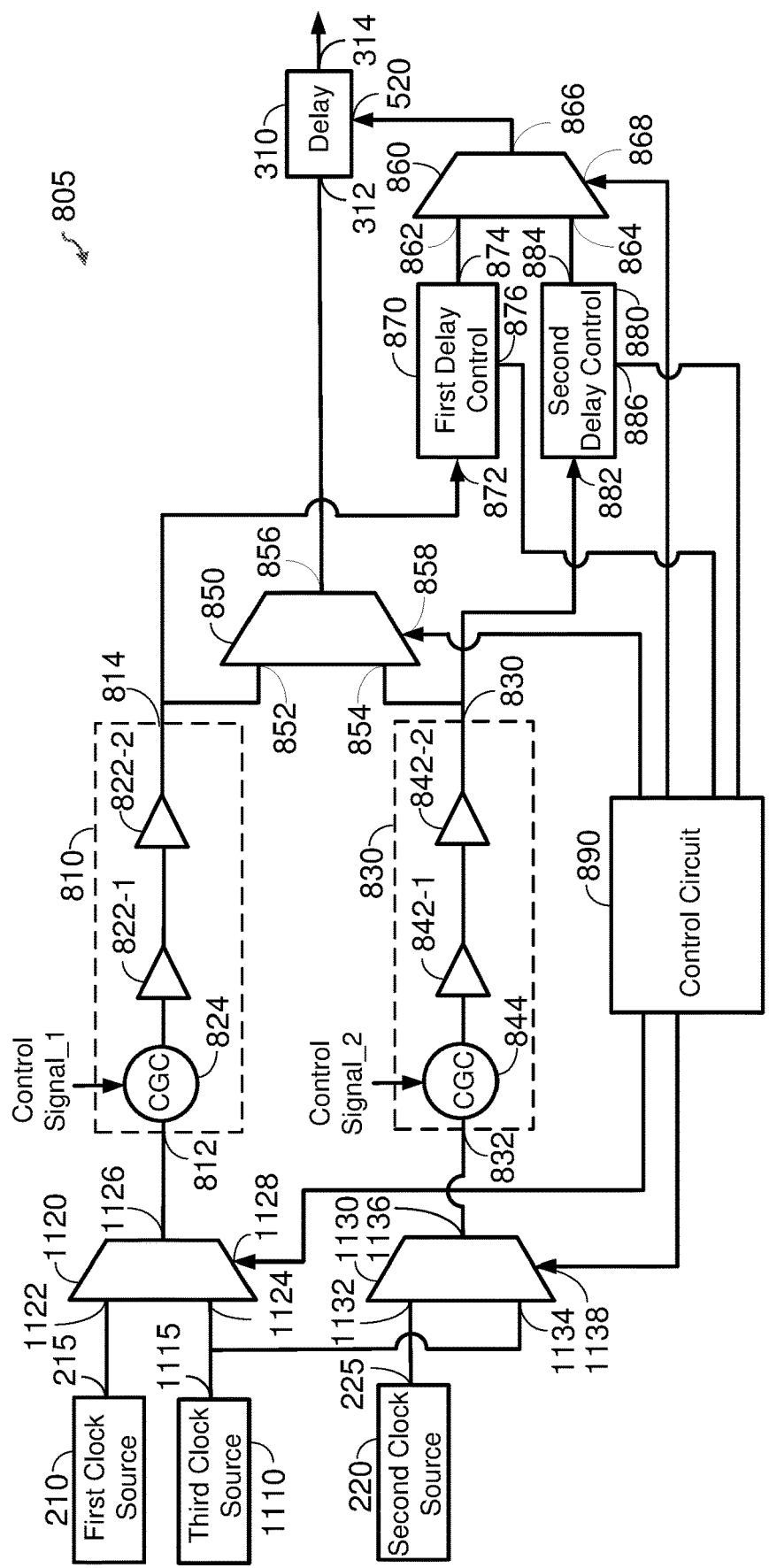
FIG. 11 shows an example of multiplexers for switching clock paths between different clock sources according to certain aspects of the present disclosure.

It is to be appreciated that the system 805 is not limited to two clock sources (i.e., the first clock source 210 and the second clock source 220). In this regard, FIG. 11 shows an example in which the system 805 includes a third clock source 1110 according to certain aspects. The third clock source 1110 is configured to generate a third clock signal, and output the third clock signal at an output 1115 of the third clock source 1110. For example, the third clock source 1110 may be implemented with a phase-locked loop (PLL). In another example, the third clock source 1110 may derive the third clock signal from the first clock signal or the second clock signal. For example, the third clock source 1110 may include a frequency divider configured to receive the first clock signal or the second clock signal, and divide the frequency of the first clock signal or the second clock signal to generate the third clock signal. In this example, the third clock signal has a frequency that is a fraction of the frequency of the first clock signal or the second clock signal.

In the example shown in FIG. 11, the system 805 also includes a first clock multiplexer 1120 and a second clock multiplexer 1130. The first clock multiplexer 1120 has a first input 1122 coupled to the output 215 of the first clock source 210, a second input 1124 coupled to the output 1115 of the third clock source 1110, a select input 1128 coupled to the control circuit 890, and an output 1126 coupled to the input 812 of the first clock path 810. The first clock multiplexer 1120 is configured to couple the first clock source 210 or the third clock source 1110 to the first clock path 810 based on a select signal from the control circuit 890.

The second clock multiplexer 1130 has a first input 1132 coupled to the output 225 of the second clock source 220, a second input 1134 coupled to the output 1115 of the third clock source 1110, a select input 1138 coupled to the control circuit 890, and an output 1136 coupled to the input 832 of the second clock path 830. The second clock multiplexer 1130 is configured to couple the second clock source 220 or the third clock source 1110 to the second clock path 830 based on a select signal from the control circuit 890.

The first clock multiplexer 1120 and the second clock multiplexer 1130 allow the system 805 to switch between the first clock source 210 and the second clock source 220. To allow this, the control circuit 890 causes the first clock multiplexer 1120 to select the first clock source 210 to couple the first clock source 210 to the first clock path 810, and causes the second clock multiplexer 1130 to select the second clock source 220 to couple the second clock source 220 to the second clock path 830. In this case, the first multiplexer 850 may switch between the first clock source 210 and the second clock source 220 in the manner discussed above with reference to FIG. 8.

The first clock multiplexer 1120 and the second clock multiplexer 1130 also allow the system 805 to switch between the first clock source 210 and the third clock source 1110. To allow this, the control circuit 890 causes the first clock multiplexer 1120 to select the first clock source 210 to couple the first clock source 210 to the first clock path 810, and causes the second clock multiplexer 1130 to select the third clock source 1110 to couple the third clock source 1110 to the second clock path 830. In this case, the third clock signal propagates through the second clock path 830. In addition, the first delay control circuit 870 generates the first delay control signal based on the first clock signal, and the second delay control circuit 880 generates the second delay control signal based on the third clock signal, which reduces clock switching latency. In this case, the control circuit 890 may switch the system 805 between the first clock signal and the third clock signal by causing the first multiplexer 850 to switch between the first clock path 810 and the second clock path 830, and causing the second multiplexer 860 to switch between the first delay control circuit 870 and the second delay control circuit 880.

The first clock multiplexer 1120 and the second clock multiplexer 1130 also allow the system 805 to switch between the second clock source 220 and the third clock source 1110. To allow this, the control circuit 890 causes the first clock multiplexer 1120 to select the third clock source 1110 to couple the third clock source 1110 to the first clock path 810, and causes the second clock multiplexer 1130 to select the second clock source 220 to couple the second clock source 220 to the second clock path 830. In this case, the third clock signal propagates through the first clock path 810. In addition, the first delay control circuit 870 generates the first delay control signal based on the third clock signal, and the second delay control circuit 880 generates the second delay control signal based on the second clock signal, which reduces clock switching latency. In this case, the control circuit 890 may switch the system 805 between the second clock signal and the third clock signal by causing the first multiplexer 850 to switch between the first clock path 810 and the second clock path 830, and causing the second multiplexer 860 to switch between the first delay control circuit 870 and the second delay control circuit 880.

Figure 12:
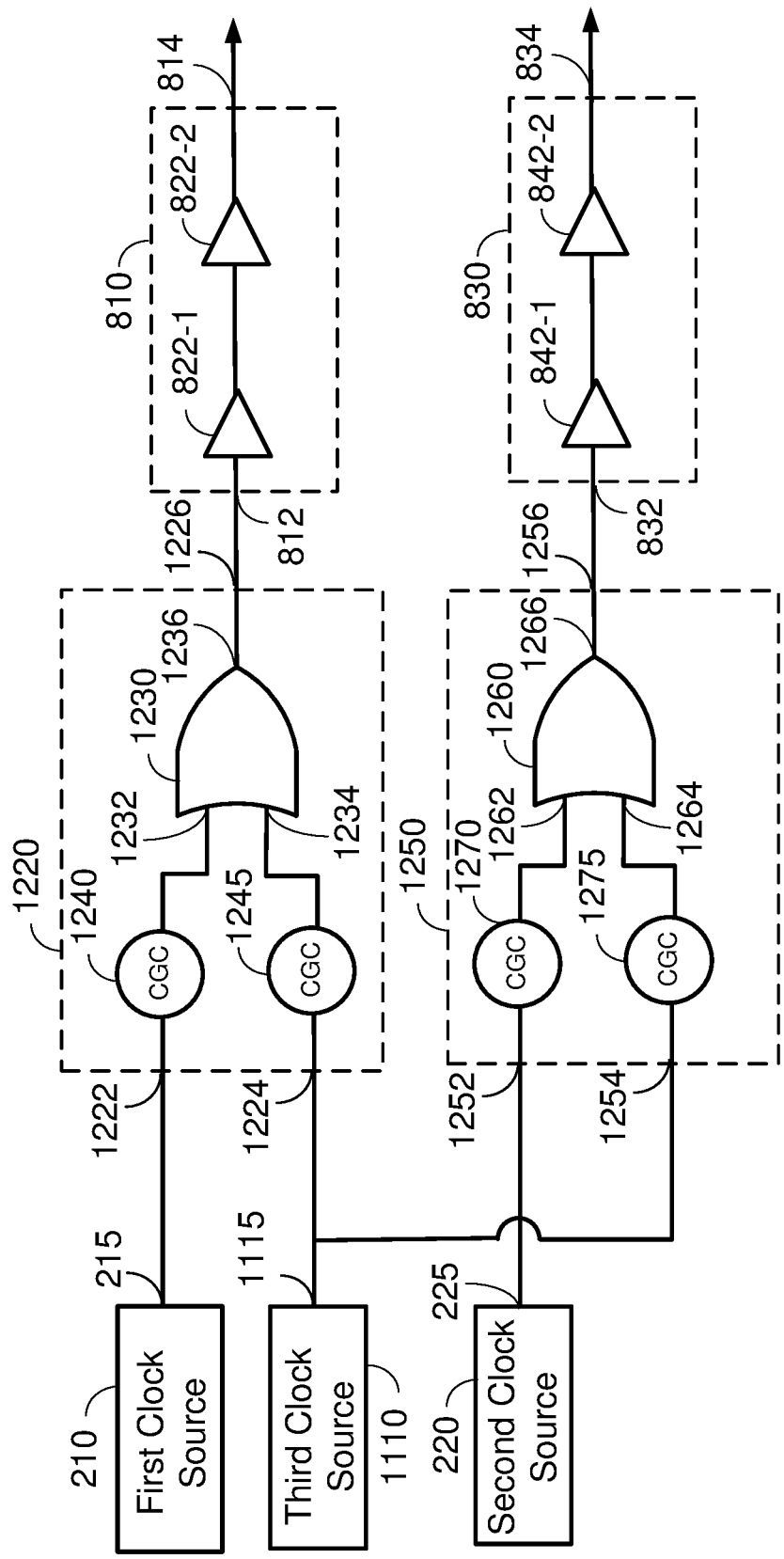
FIG. 12 shows an example of circuits combining multiplexing functionality and clock gating functionality according to certain aspects of the present disclosure.

FIG. 12 shows an example in which the first clock multiplexer 1120 and the clock gating circuit 824 shown in FIG. 11 are replaced by a first circuit 1220 that provides both multiplexing functionality and clock gating functionality, and the second clock multiplexer 1130 and the clock gating circuit 844 shown in FIG. 11 are replaced by a second circuit 1250 that provides both multiplexing functionality and clock gating functionality.

The first circuit 1220 has a first input 1222 coupled to the output 215 of the first clock source 210, a second input 1224 coupled to the output 1115 of the third clock source 1110, and an output 1226 coupled to the input 812 of the first clock path 810. The first circuit 1220 includes a first clock gating circuit 1240, a second clock gating circuit 1245, and an OR gate 1230. The first clock gating circuit 1240 is coupled between the first input 1222 of the first circuit 1220 and a first input 1232 of the OR gate 1230, and the second clock gating circuit 1245 is coupled between the second input 1224 of the first circuit 1220 and a second input 1234 of the OR gate 1230. The output 1236 of the OR gate 1230 is coupled to the output 1226 of the first circuit 1220. In certain aspects, the first clock gating circuit 1240 and the second clock gating circuit 1245 are controlled by the control circuit 890 (shown in FIG. 11). In this disclosure, it is to be understood that an OR gate may be implemented with one logic gate or a combination of two or more logic gates (e.g., one or more NAND gates, one or more NOR gates, one or more inverters, or any combination thereof) that are arranged to perform an OR operation. In some implementations, an OR gate may be implemented with a NOR gate followed by an inverter.

To select the first clock source 210, the control circuit 890 causes the first clock gating circuit 1240 to pass (i.e., un-gate) the first clock signal from the first clock source 210 to the first input 1232 of the OR gate 1230, and causes the second clock gating circuit 1245 to gate the third clock signal from the third clock source 1110 and output a logic zero to the second input 1234 of the OR gate 1230. This causes the first circuit 1220 to pass the first clock signal to the first clock path 810, and therefore select the first clock source 210.

To select the third clock source 1110, the control circuit 890 causes the first clock gating circuit 1240 to gate the first clock signal and output a logic zero to the first input 1232 of the OR gate 1230, and causes the second clock gating circuit 1245 to pass the third clock signal to the second input 1234 of the OR gate 1230. This causes the first circuit 1220 to pass the third clock signal to the first clock path 810, and therefore select the third clock source 1110.

To gate both the first clock signal and the third clock signal (i.e., block both clock signals from the first clock path 810), the control circuit 890 causes the first clock gating circuit 1240 to gate the first clock signal and output a logic zero to the first input 1232 of the OR gate 1230, and causes the second clock gating circuit 1245 to gate the third clock signal and output a logic zero to the second input 1234 of the OR gate 1230. In this case, the OR gate 1230 outputs a logic zero to the first clock path 810.

Thus, the first circuit 1220 provides both multiplexing functionality and clock gating functionality. In this regard, the first circuit 1220 may also be referred to as a multiplexer in which the multiplexer has clock gating functionality.

The second circuit 1250 has a first input 1252 coupled to the output 225 of the second clock source 220, a second input 1254 coupled to the output 1115 of the third clock source 1110, and an output 1256 coupled to the input 832 of the second clock path 830. The second circuit 1250 includes a first clock gating circuit 1270, a second clock gating circuit 1275, and an OR gate 1260. The first clock gating circuit 1270 is coupled between the first input 1252 of the second circuit 1250 and a first input 1262 of the OR gate 1260, and the second clock gating circuit 1275 is coupled between the second input 1254 of the second circuit 1250 and a second input 1264 of the OR gate 1260. The output 1266 of the OR gate 1260 is coupled to the output 1256 of the second circuit 1250. In certain aspects, the first clock gating circuit 1270 and the second clock gating circuit 1275 are controlled by the control circuit 890 (shown in FIG. 11).

To select the second clock source 220, the control circuit 890 causes the first clock gating circuit 1270 to pass (i.e., un-gate) the second clock signal from the second clock source 220 to the first input 1262 of the OR gate 1260, and causes the second clock gating circuit 1275 to gate the third clock signal from the third clock source 1110 and output a logic zero to the second input 1264 of the OR gate 1260. This causes the second circuit 1250 to pass the second clock signal to the second clock path 830, and therefore select the second clock source 220.

To select the third clock source 1110, the control circuit 890 causes the first clock gating circuit 1270 to gate the second clock signal and output a logic zero to the first input 1262 of the OR gate 1260, and causes the second clock gating circuit 1275 to pass the third clock signal to the second input 1264 of the OR gate 1260. This causes the second circuit 1250 to pass the third clock signal to the second clock path 830, and therefore select the third clock source 1110.

To gate both the second clock signal and the third clock signal (i.e., block both clock signals from the second clock path 830), the control circuit 890 causes the first clock gating circuit 1270 to gate the second clock signal and output a logic zero to the first input 1262 of the OR gate 1260, and causes the second clock gating circuit 1275 to gate the third clock signal and output a logic zero to the second input 1264 of the OR gate 1260. In this case, the OR gate 1260 outputs a logic zero to the second clock path 830.

Thus, the second circuit 1250 provides both multiplexing functionality and clock gating functionality. In this regard, the second circuit 1250 may also be referred to as a multiplexer in which the multiplexer has clock gating functionality.

Figure 13:
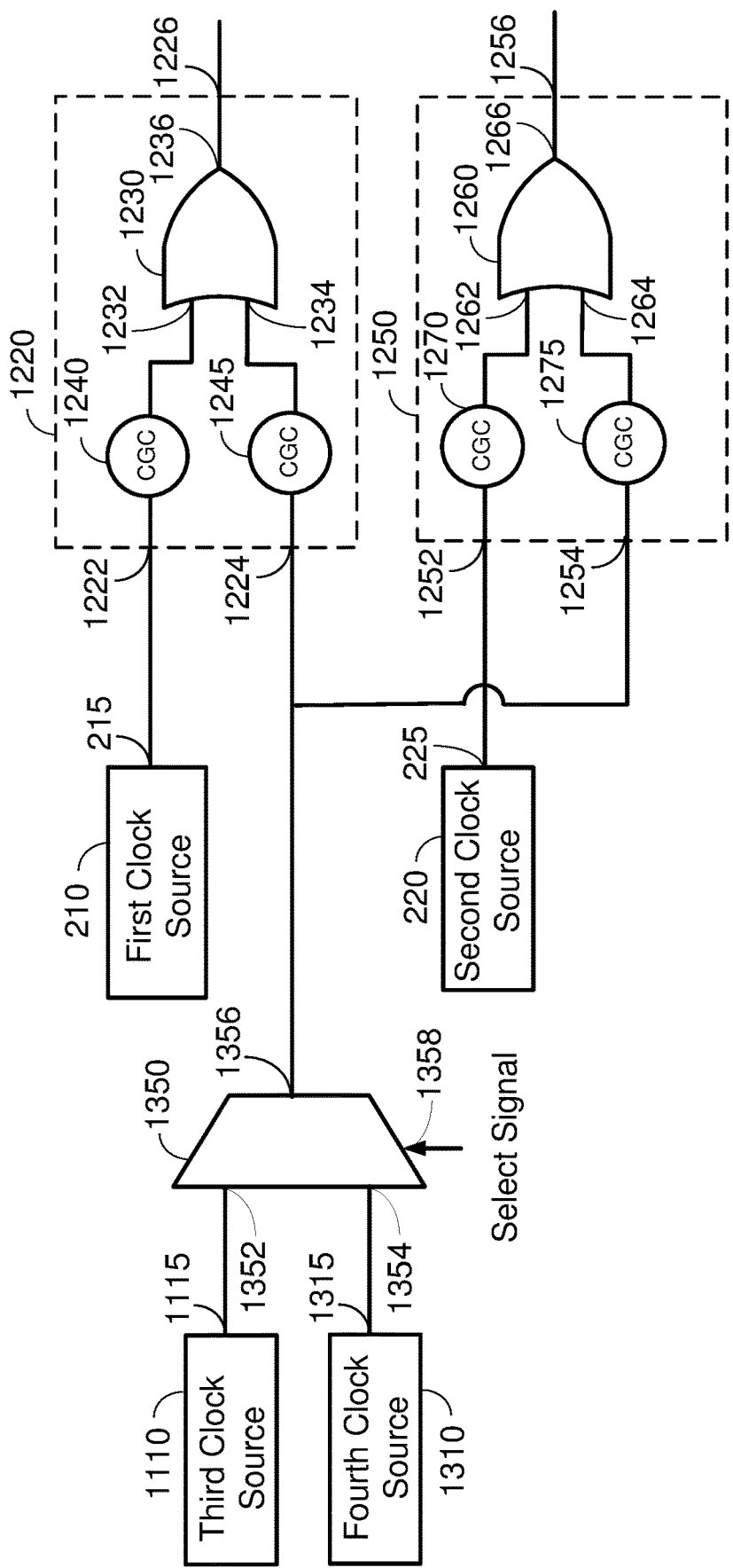
FIG. 13 shows an example of a multiplexer configured to switch between clock sources according to certain aspects of the present disclosure.

It is to be appreciated that additional clock sources may be added to the system 805 (e.g., to support a larger number of frequency modes). In this regard, FIG. 13 shows an example in which the system 805 further includes a fourth clock source 1310, and a clock multiplexer 1350. The fourth clock source 1310 is configured to generate a fourth clock signal, and output the fourth clock signal at an output 1315 of the fourth clock source 1310. The fourth clock source 1310 may be implemented with a PLL or another type of clock source.

The clock multiplexer 1350 has a first input 1352 coupled to the output 1115 of the third clock source 1110, a second input 1354 coupled to the output 1315 of the fourth clock source 1310, a select input 1328 coupled to the control circuit 890, and an output 1356 coupled to the second inputs 1224 and 1254 of the first and second circuits 1220 and 1250. The clock multiplexer 1350 is configured to couple the third clock source 1110 or the fourth clock source 1310 to the second inputs 1224 and 1254 of the first and second circuits 1220 and 1250 based on the select signal from the control circuit 890.

The clock multiplexer 1350 allows the system 805 to switch between the first clock source 210 and the third clock source 1110, and switch between the second clock source and the third clock source. To allow this, the control circuit 890 causes the clock multiplexer 1350 to select the third clock source 1110, thereby passing the third clock signal to the second inputs 1224 and 1254 of the first and second circuits 1220 and 1250. The first circuit 1220 and the second circuit 1250 may then switch the system 805 between the first clock source 210 and the third clock source 1110, or switch the system 805 between the second clock source and the third clock source 1110 in the manner discussed above with reference to FIG. 11.

The clock multiplexer 1350 also allows the system 805 to switch between the first clock source 210 and the fourth clock source 1310, and switch between the second clock source 220 and the fourth clock source 1310. To allow this, the control circuit 890 causes the clock multiplexer 1350 to select the fourth clock source 1310, thereby passing the fourth clock signal to the second inputs 1224 and 1254 of the first and second circuits 1220 and 1250.

To allow switching between the first clock source 210 and the fourth clock source 1310, the control circuit 890 causes the clock multiplexer 1350 to select the second input 1354 (which is coupled to the fourth clock source 1310), causes the first circuit 1220 to select the first input 1222 (which is coupled to the first clock source 210), and causes the second circuit 1250 to select the second input 1254 (which is coupled to the fourth clock source 1310 through the clock multiplexer 1350). In this case, the fourth clock signal propagates through the second clock path 830. In addition, the first delay control circuit 870 generates the first delay control signal based on the first clock signal, and the second delay control circuit 880 generates the second delay control signal based on the fourth clock signal, which reduces clock switching latency. In this case, the control circuit 890 may switch the system 805 between the first clock signal and the fourth clock signal by causing the first multiplexer 850 to switch between the first clock path 810 and the second clock path 830, and causing the second multiplexer 860 to switch between first delay control circuit 870 and the second delay control circuit 880.

To allow switching between the second clock source 220 and the fourth clock source 1310, the control circuit 890 causes the clock multiplexer 1350 to select the second input 1354 (which is coupled to the fourth clock source 1310), causes the first circuit 1220 to select the second input 1224 (which is coupled to the fourth clock source 1310 through the clock multiplexer 1310), and causes the second circuit 1250 to select the first input 1252 (which is coupled to the second clock source 220). In this case, the fourth clock signal propagates through the first clock path 810. In addition, the first delay control circuit 870 generates the first delay control signal based on the fourth clock signal, and the second delay control circuit 880 generates the second delay control signal based on the second clock signal, which reduces clock switching latency. In this case, the control circuit 890 may switch the system 805 between the second clock signal and the fourth clock signal by causing the first multiplexer 850 to switch between the first clock path 810 and the second clock path 830, and causing the second multiplexer 860 to switch between first delay control circuit 870 and the second delay control circuit 880.

Figure 14A:
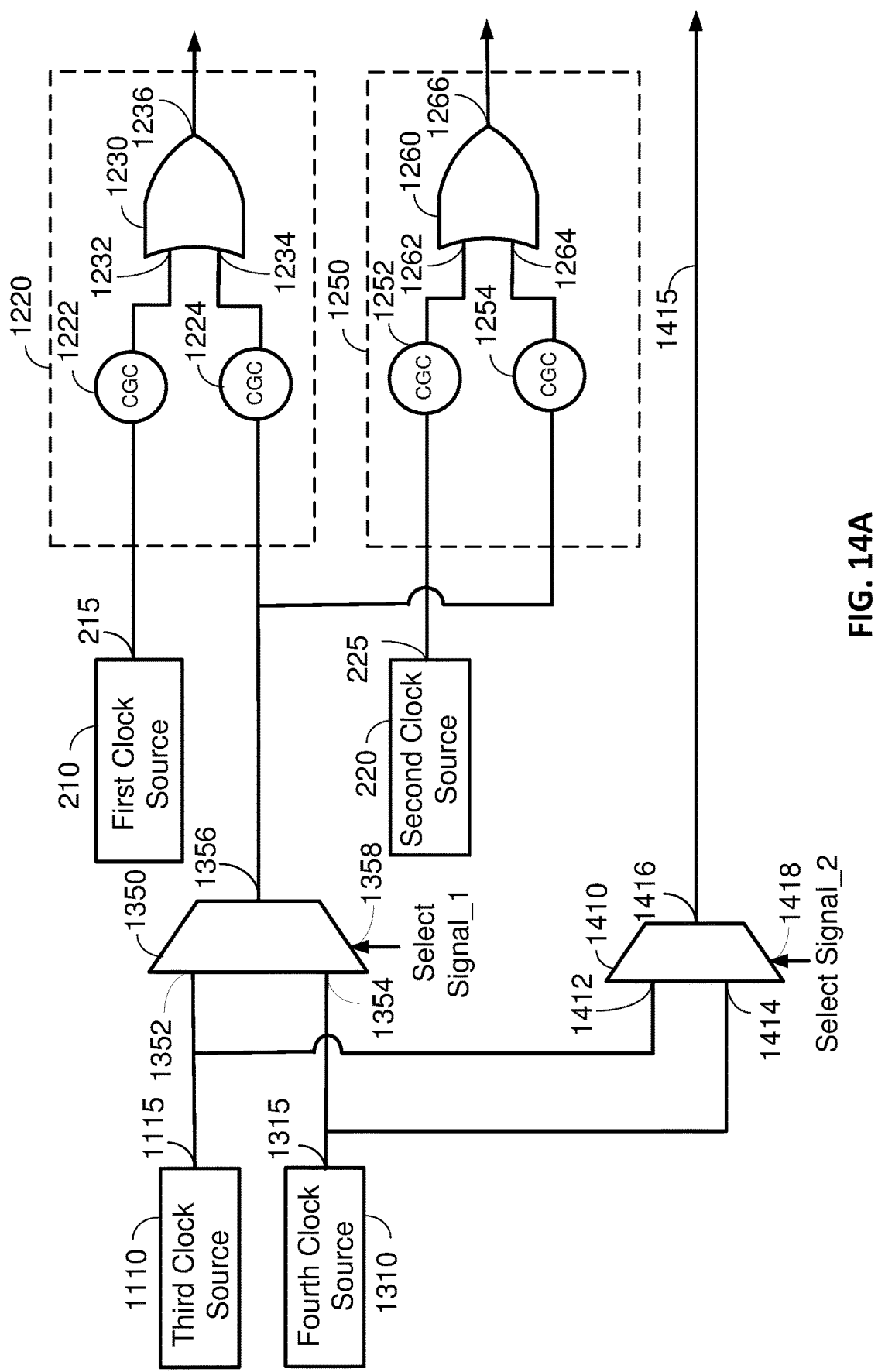
FIGS. 14A and 14B show an example of a system including multiplexers for switching delay control circuits between clock paths according to certain aspects of the present disclosure.
Figure 14B:
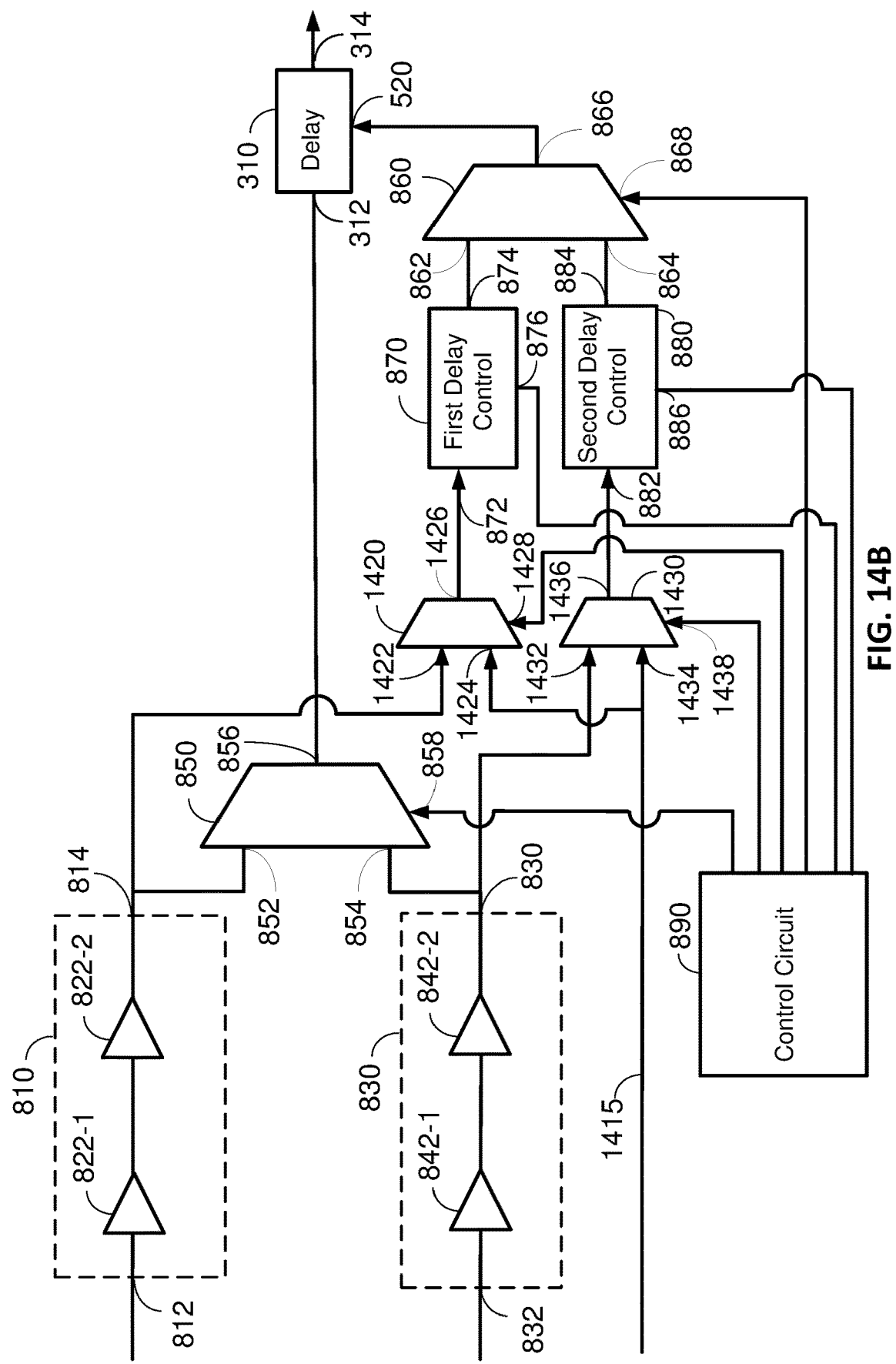

FIGS. 14A and 14B show an example in which the system 805 includes a third clock path 1415 that may be used to send the third clock signal or the fourth clock signal to the first delay control circuit 870 or the second delay control circuit 880 as an alternative to the first and second clock paths 810 and 830. In this example, the system 805 also includes a first control multiplexer 1410 (shown in FIG. 14A), a second control multiplexer 1420 (shown in FIG. 14B), and a third control multiplexer 1430 (shown in FIG. 14B).

The first control multiplexer 1410 has first input 1412 coupled to the output 1115 of the third clock source 1110, a second input 1414 coupled to the output 1315 of the fourth clock source 1310, a select input 1418 coupled to the control circuit 890 (shown in FIG. 14B), and an output 1416. The second control multiplexer 1420 has first input 1422 coupled to the output 814 of the first clock path 810, a second input 1424, a select input 1428 coupled to the control circuit 890, and an output 1426 coupled to the input 872 of the first delay control circuit 870. The third control multiplexer 1430 has first input 1432 coupled to the output 834 of the second clock path 830, a second input 1434, a select input 1438 coupled to the control circuit 890, and an output 1436 coupled to the input 882 of the second delay control circuit 880. The third clock path 1415 is coupled between the output 1416 of the first control multiplexer 1410 and the second input 1424 of the second control multiplexer 1420. The third clock path 1415 is also coupled between the output 1416 of the first control multiplexer 1410 and the second input 1434 of the third control multiplexer 1430. It is to be appreciated that the third clock path 1415 may include one or more delay buffers (not shown) in some implementations.

The control multiplexers 1410, 1420, and 1430 allow the control circuit 890 to couple the third clock source 1110 to the first delay control circuit 870 or the second delay control circuit 880 via the third clock path 1415. For example, to couple the third clock source 1110 to the first delay control circuit 870, the control circuit 890 causes the first control multiplexer 1410 to select the first input 1412, and causes the second control multiplexer 1420 to select the second input 1424. To couple the third clock source 1110 to the second delay control circuit 880, the control circuit 890 causes the first control multiplexer 1410 to select the first input 1412, and causes the third control multiplexer 1430 to select the second input 1434.

The control multiplexers 1410, 1420, and 1430 also allow the control circuit 890 to couple the fourth clock source 1310 to the first delay control circuit 870 or the second delay control circuit 880 via the third clock path 1415. For example, to couple the fourth clock source 1310 to the first delay control circuit 870, the control circuit 890 causes the first control multiplexer 1410 to select the second input 1414, and causes the second control multiplexer 1420 to select the second input 1424. To couple the fourth clock source 1310 to the second delay control circuit 880, the control circuit 890 causes the first control multiplexer 1410 to select the second input 1414, and causes the third control multiplexer 1430 to select the second input 1434.

When the system 805 switches between the first clock source 210 and the second clock source 220, the control circuit 890 may cause the second control multiplexer 1420 to select the first input 1422 and cause the third control multiplexer 1430 to select the first input 1432. In this case, the input 872 of the first delay control circuit 870 is coupled to the first clock path 810, and the input 882 of the second delay control circuit 880 is coupled to the second clock path 830.

When the system 805 switches between the first clock source 210 and the third clock source 1110, the control circuit 890 may cause the second control multiplexer 1420 to select the first input 1422. The control circuit 890 may also cause the third control multiplexer 1430 to select the first input 1432 to receive the third clock signal via the second clock path 830. Alternately, the control circuit 890 may cause the third control multiplexer 1430 to select the second input 1434 to receive the third clock signal via the third clock path 1415. In this case, the control circuit 890 causes the first control multiplexer 1410 to select the first input 1412.

When the system 805 switches between the first clock source 210 and the fourth clock source 1310, the control circuit 890 may cause the second control multiplexer 1420 to select the first input 1422. The control circuit 890 may also cause the third control multiplexer 1430 to select the first input 1432 to receive the fourth clock signal via the second clock path 830. Alternately, the control circuit 890 may cause the third control multiplexer 1430 to select the second input 1434 to receive the fourth clock signal via the third clock path 1415. In this case, the control circuit 890 causes the first control multiplexer 1410 to select the second input 1414.

When the system 805 switches between the second clock source 220 and the third clock source 1110, the control circuit 890 may cause the third control multiplexer 1430 to select the first input 1432. The control circuit 890 may also cause the second control multiplexer 1420 to select the first input 1422 to receive the third clock signal via the first clock path 810. Alternately, the control circuit 890 may cause the second control multiplexer 1420 to select the second input 1424 to receive the third clock signal via the third clock path 1415. In this case, the control circuit 890 causes the first control multiplexer 1410 to select the first input 1412.

When the system 805 switches between the second clock source 220 and the fourth clock source 1310, the control circuit 890 may cause the third control multiplexer 1430 to select the first input 1432. The control circuit 890 may also cause the second control multiplexer 1420 to select the first input 1422 to receive the fourth clock signal via the first clock path 810. Alternately, the control circuit 890 may cause the second control multiplexer 1420 to select the second input 1424 to receive the fourth clock signal via the third clock path 1415. In this case, the control circuit 890 causes the first control multiplexer 1410 to select the second input 1414.

Thus, the third clock path 1415 provides an alternative path for sending the third clock signal or the fourth clock signal to the first delay control circuit 870 or the second delay control circuit 880.

In certain aspects, the third clock path 415 may be used to facilitate clock switching between the third clock signal and the fourth clock signal.

For example, the control circuit 890 may switch the delay circuit 310 from the third clock signal to the fourth clock signal as follows. Initially, the control circuit 890 may cause the clock multiplexer 1350 to select the third clock source 1110, and cause the first circuit 1220 to pass the third clock signal to the first clock path 810 to propagate the third clock signal through the first clock path 810. The control circuit 890 may also cause the first multiplexer 850 to select the first clock path 810 to pass the third clock signal to the delay circuit 310, cause the second control circuit 1420 to select the first input 1422 to pass the third clock signal to the first delay control circuit 870, and cause the second multiplexer 860 to select the first delay control circuit 870.

Before the switch from the third clock signal to the fourth clock signal, the control circuit 890 may cause the first control multiplexer 1410 to select the fourth clock source 1310 to propagate the fourth clock signal through the third clock path 1415, and cause the third control multiplexer 1430 to select the second input 1434 to pass the fourth clock signal to the second delay control circuit 880 so the second delay control circuit 880 generates the second delay control signal based on the fourth clock signal. The control circuit 890 may then switch the delay circuit 310 from the third clock signal to the fourth clock signal by causing the clock multiplexer 1350 to switch from the third clock source 1110 to the fourth clock source 1310, causing the second circuit 1250 to pass the fourth clock signal to the second clock path 830, causing the first multiplexer 850 to switch from the first clock path 810 to the second clock path 830, and causing the second multiplexer 860 to switch from the first delay control circuit 870 to the second delay control circuit 880.

In another example, the control circuit 890 may switch the delay circuit 310 from the third clock signal to the fourth clock signal as follows. Initially, the control circuit 890 may cause the clock multiplexer 1350 to select the third clock source 1110, and cause the second circuit 1250 to pass the third clock signal to the second clock path 830. The control circuit 890 may also cause the first multiplexer 850 to select the second clock path 830 to pass the third clock signal to the delay circuit 310, cause the third control circuit 1430 to select the first input 1432 to pass the third clock signal to the second delay control circuit 880, and cause the second multiplexer 860 to select the second delay control circuit 880.

Before the switch from the third clock signal to the fourth clock signal, the control circuit 890 may cause the first control multiplexer 1410 to select the fourth clock source 1310 to propagate the fourth clock signal through the third clock path 1415, and cause the second control multiplexer 1420 to select the second input 1424 to pass the fourth clock signal to the first delay control circuit 870 so that the first delay control circuit 870 generates the first delay control signal based on the fourth clock signal. The control circuit 890 may then switch the delay circuit 310 from the third clock signal to the fourth clock signal by causing the clock multiplexer 1350 to switch from the third clock source 1110 to the fourth clock source 1310, causing the first circuit 1220 to pass the fourth clock signal to the first clock path 810, causing the first multiplexer 850 to switch from the second clock path 830 to the first clock path 810, and causing the second multiplexer 860 to switch from the second delay control circuit 880 to the first delay control circuit 870.

The control circuit 890 may also switch the delay circuit 310 from the fourth clock signal to the third clock signal in a similar manner as discussed above for the switch from the third clock signal to the fourth clock signal.

In certain aspects, the first clock signal and the second clock signal may each have a higher frequency than the third clock signal and the fourth clock signal (e.g., to facilitate a high data transfer speed in a high performance mode). For example, each of the first clock signal and the second clock signal may have a frequency above one gigahertz, and each of the third clock signal and the fourth clock signal may have a frequency below one gigahertz. However, it is to be appreciated that the present disclosure is not limited to this example.

In these aspects, the third clock signal and the fourth clock signal may each have a low frequency compared with the frequencies of the first clock signal and the second clock signal. For example, the third clock signal and the fourth clock signal may each have a low frequency to reduce power in a low performance mode (e.g., a mode that does not require a high data transfer speed). In this example, the third clock path 1415 may be configured to satisfy more relaxed timing specifications (e.g., higher tolerable jitter, higher tolerable duty cycle distortion, etc.) compared with the first and second clock path 810 and 830 since the lower frequencies of the third clock signal and the fourth clock signal relax the timing requirements for the third clock path 1415. However, it is to be appreciated that the present disclosure is not limited to this example.

Figure 15:
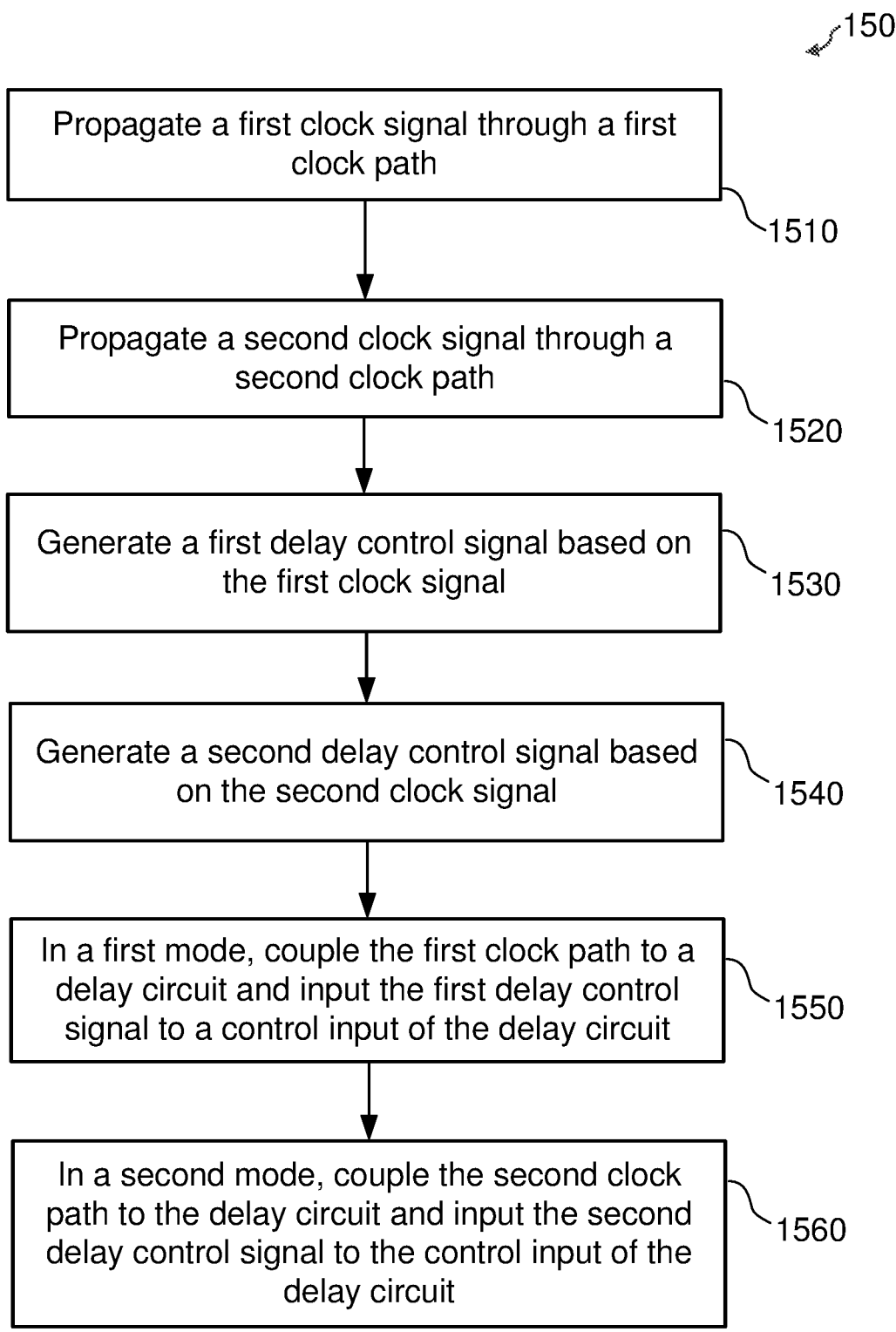
FIG. 15 is a flowchart illustrating a method for clock switching according to certain aspects of the present disclosure.

FIG. 15 illustrates a method 1500 for clock switch according to certain aspects. The method 1500 may be performed by the system 805 illustrates in any one of the examples shown in FIGS. 8, 9, 10, 11, 12, 13, 14A, and 14B.

At block 1510, a first clock signal propagates through a first clock path. For example, the first clock signal may be generated by the first clock source 210, and the first clock path may correspond to the first clock path 810.

At block 1520, a second clock signal propagates through a second clock path. For example, the second clock signal may be generated by the second clock source 220, and the second clock path may correspond to the second clock path

830. In certain aspects, a frequency of the first clock signal may be different from a frequency of the second clock signal.

At block 1530, a first delay control signal is generated based on the first clock signal. For example, the first delay control signal may be generated by the first delay control circuit 870 (e.g., first instance of the DLL 510).

At block 1540, a second delay control signal is generated based on the second clock signal. For example, the second delay control signal may be generated by the second delay control circuit 880 (e.g., second instance of the DLL 510).

At block 1550, in a first mode, the first clock path is coupled to a delay circuit and the first delay control signal is input to a control input of the delay circuit. For example, the delay circuit may correspond to delay circuit 310 and the control input may correspond to the control input 420. The first clock path may be coupled to the delay circuit by the first multiplexer 850, and the first delay control signal may be input to the control input of the delay circuit by the second multiplexer 860.

At block 1560, in a second mode, the second clock path is coupled to the delay circuit and the first delay control signal is input to the control input of the delay circuit. The second clock path may be coupled to the delay circuit by the first multiplexer 850, and the second delay control signal may be input to the control input of the delay circuit by the second multiplexer 860.

In certain aspects, generating the first delay control signal based on the first clock signal includes generating the first delay control signal based on the first clock signal using a first delay-locked loop (DLL), and generating the second delay control signal based on the second clock signal comprises generating the second delay control signal based on the second clock signal using a second DLL. For example, the first DLL may correspond to the first delay control circuit 870 including a first instance of the DLL 510, and the second DLL may correspond to the second delay control circuit 880 including a second instance of the DLL 510.

In certain aspects, the first delay control signal sets a delay of the delay circuit to a first delay, and the second delay control signal sets the delay of the delay circuit to a second delay, wherein the first delay and the second delay are different. In certain aspects, the first delay is equal to a first fraction of a cycle of the first clock signal, and the second delay is equal to a second fraction of a cycle of the second clock signal. In certain aspects, the first fraction and the second fraction are equal.

In certain aspects, generating the first delay control signal and generating the second delay control signal overlap during a time period. For example, the time period may provide the second DLL with enough time to lock before switching the delay circuit from the first clock signal to the second clock signal. The method 1500 may further include receiving a signal indicating that the second DLL is locked during the time period, and switching from the first mode to the second mode after receiving the signal. The switching from the first mode to the second mode switches the delay circuit from the first clock signal to the second clock signal.

In certain aspects, the method 1500 further includes switching from the first mode to the second mode, wherein switching from the first mode to the second mode includes switching from coupling the first clock path to the delay circuit to coupling the second clock path to the delay circuit and at a same time switching from inputting the first delay control signal to the control input of the delay circuit to inputting the second delay control signal to the control input of the delay circuit. For example, the switching may be performed by the control circuit 890, the first multiplexer 850, and the second multiplexer 860.

In certain aspects, the method 1500 further includes switching from the second mode to the first mode, wherein switching from the second mode to the first mode includes switching from coupling the second clock path to the delay circuit to coupling the first clock path to the delay circuit and at a same time switching from inputting the second delay control signal to the control input of the delay circuit to inputting the first delay control signal to the control input of the delay circuit. For example, the switching may be performed by the control circuit 890, the first multiplexer 850, and the second multiplexer 860.

The control circuit 890 may be implemented with a general-purpose processor, a digital signal processor (DSP), an application specific integrated circuit (ASIC), a field programmable gate array (FPGA) or other programmable logic device, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A system, comprising:
    a first clock path;
    a second clock path;
    a delay circuit;
    a first multiplexer having a first input, a second input, and an output, wherein the first input of the first multiplexer is coupled to the first clock path, the second input of the first multiplexer is coupled to the second clock path, and the output of the first multiplexer is coupled to the delay circuit;
    a first delay control circuit having an input and an output, wherein the input of the first delay control circuit is coupled to the first clock path;
    a second delay control circuit having an input and an output, wherein the input of the second delay control circuit is coupled to the second clock path; and
    a second multiplexer having a first input, a second input, and an output, wherein the first input of the second multiplexer is coupled to the output of the first delay control circuit, the second input of the second multiplexer is coupled to the output of the second delay control circuit, and the output of the second multiplexer is coupled to a control input of the delay circuit.
2. The system of clause 1, wherein the first delay control circuit comprises a first delay-locked loop (DLL), and the second delay control circuit comprises a second DLL.
3. The system of clause 1 or 2, further comprising a clock transmitter, wherein the delay circuit is coupled between the output of the first multiplexer and the clock transmitter.
4. The system of any one of clauses 1 to 3, further comprising:
    a first clock source, wherein the first clock path is coupled between the first clock source and the first input of the first multiplexer; and
    a second clock source, wherein the second clock path is coupled between the second clock source and the second input of the first multiplexer.

5. The system of clause 4, wherein first clock path comprises first clock buffers, and the second clock path comprises second clock buffers.

6. The system of clause 4 or 5, wherein:
the first clock source is configured to generate a first clock signal, and output the first clock signal to the first clock path; and
the first delay control circuit is configured to receive the first clock signal at the input of the first delay control circuit via the first clock path, generate a first delay control signal based on the first clock signal, and output the first delay control signal at the output of the first delay control circuit.

7. The system of clause 6, wherein:
the second clock source is configured to generate a second clock signal, and output the second clock signal to the second clock path; and
the second delay control circuit is configured to receive the second clock signal at the input of the second delay control circuit via the second clock path, generate a second delay control signal based on the second clock signal, and output the second delay control signal at the output of the second delay control circuit.

8. The system of clause 7, wherein:
the first delay control signal is configured to set a delay of the delay circuit to a first fraction of a cycle of the first clock signal; and
the second delay control signal is configured to set the delay of the delay circuit to a second fraction of a cycle of the second clock signal.

9. The system of clause 8, wherein the first fraction and the second fraction are equal.

10. The system of any one of clauses 7 to 9, wherein a frequency of the first clock signal is different from a frequency of the second clock signal.

11. The system of any one of clauses 7 to 10, wherein the first delay control circuit comprises a first delay-locked loop (DLL), and the second delay control circuit comprises a second DLL.

12. The system of any one of clauses 1 to 11, further comprising a control circuit configured to:
in a first mode, cause the first multiplexer to select the first input of the first multiplexer and cause the second multiplexer to select the first input of the second multiplexer; and
in a second mode, cause the second multiplexer to select the second input of the first multiplexer and cause the second multiplexer to select the second input of the second multiplexer.

13. The system of clause 12, wherein, to switch from the first mode to the second mode, the control circuit is configured to:
cause the first multiplexer to switch from the first input of the first multiplexer to the second input of the first multiplexer and at a same time cause the second multiplexer to switch from the first input of the second multiplexer to the second input of the second multiplexer.

14. The system of clause 12 or 13, wherein, to switch from the second mode to the first mode, the control circuit is configured to:
cause the first multiplexer to switch from the second input of the first multiplexer to the first input of the first multiplexer and at a same time cause the second multiplexer to switch from the second input of the second multiplexer to the first input of the second multiplexer.

15. The system of any one of clauses 1 to 14, further comprising:
a first clock source;
a second clock source;
a third clock source;
a third multiplexer having a first input, a second input, and an output, wherein the first input of the third multiplexer is coupled to the first clock source, the second input of the third multiplexer is coupled to the third clock source, and the first clock path is coupled between the output of the third multiplexer and the first input of the first multiplexer; and
a fourth multiplexer having a first input, a second input, and an output, wherein the first input of the fourth multiplexer is coupled to the second clock source, the second input of the fourth multiplexer is coupled to the third clock source, and the second clock path is coupled between the output of the fourth multiplexer and the second input of the first multiplexer.

16. The system of clause 15, wherein the third multiplexer comprises:
an OR gate having a first input, a second input, and an output, wherein the output of the OR gate is coupled to the output of the third multiplexer;
a first clock gating circuit coupled between the first input of the third multiplexer and the first input of the OR gate; and
a second clock gating circuit coupled between the second input of the third multiplexer and the second input of the OR gate.

17. The system of any one of clauses 1 to 14, further comprising:
a first clock source;
a second clock source;
a third clock source;
a fourth clock source;
a third multiplexer having a first input, a second input, and an output, wherein the first input of the third multiplexer is coupled to the third clock source, and the second input of the third multiplexer is coupled to the fourth clock source;
a fourth multiplexer having a first input, a second input, and an output, wherein the first input of the fourth multiplexer is coupled to the first clock source, the second input of the fourth multiplexer is coupled to the output of the third multiplexer, and the first clock path is coupled between the output of the fourth multiplexer and the first input of the first multiplexer; and
a fifth multiplexer having a first input, a second input, and an output, wherein the first input of the fifth multiplexer is coupled to the second clock source, the second input of the fifth multiplexer is coupled to the output of the third multiplexer, and the second clock path is coupled between the output of the fifth multiplexer and the second input of the first multiplexer.

18. The system of clause 17, wherein the fourth multiplexer comprises:
an OR gate having a first input, a second input, and an output, wherein the output of the OR gate is coupled to the output of the fourth multiplexer;

a first clock gating circuit coupled between the first input of the fourth multiplexer and the first input of the OR gate; and a second clock gating circuit coupled between the second input of the fourth multiplexer and the second input of the OR gate.

19. The system of clause 17 or 18, further comprising:
a third clock path;
a sixth multiplexer having a first input, a second input, and an output, wherein the first input of the sixth multiplexer is coupled to the third clock source, the second input of the sixth multiplexer is coupled to the fourth clock source;
a seventh multiplexer having a first input, a second input, and an output, wherein the first input of the seventh multiplexer is coupled to the first clock path, the third clock path is coupled between the output of the sixth multiplexer and the second input of the seventh multiplexer, and the output of the seventh multiplexer is coupled to the input of the first delay control circuit; and
an eighth multiplexer having a first input, a second input, and an output, wherein the first input of the seventh multiplexer is coupled to the second clock path, the third clock path is coupled between the output of the sixth multiplexer and the second input of the eighth multiplexer, and the output of the eighth multiplexer is coupled to the input of the second delay control circuit.

20. A method for clock switching, comprising:
propagating a first clock signal through a first clock path;
propagating a second clock signal through a second clock path;
generating a first delay control signal based on the first clock signal;
generating a second delay control signal based on the second clock signal;
in a first mode, coupling the first clock path to a delay circuit and inputting the first delay control signal to a control input of the delay circuit; and
in a second mode, coupling the second clock path to the delay circuit and inputting the second delay control signal to the control input of the delay circuit.

21. The method of clause 20, wherein:
generating the first delay control signal based on the first clock signal comprises generating the first delay control signal based on the first clock signal using a first delay-locked loop (DLL); and
generating the second delay control signal based on the second clock signal comprises generating the second delay control signal based on the second clock signal using a second DLL.

22. The method of clause 20 or 21, wherein:
the first delay control signal sets a delay of the delay circuit to a first delay; and
the second delay control signal sets the delay of the delay circuit to a second delay, wherein the first delay and the second delay are different.

23. The method of clause 22, wherein:
the first delay is equal to a first fraction of a cycle of the first clock signal; and
the second delay is equal to a second fraction of a cycle of the second clock signal.

24. The method of clause 23, wherein the first fraction and the second fraction are equal.

25. The method of clause 23 or 24, wherein a frequency of the first clock signal is different from a frequency of the second clock signal.

26. The method of any one of clauses 20 to 25, wherein generating the first delay control signal and generating the second delay control signal overlap during a time period.

27. The method of clause 26, further comprising:
receiving a signal indicating that the second DLL is locked during the time period; and
switching from the first mode to the second mode after receiving the signal.

28. The method of any one of clauses 20 to 27, further comprising switching from the first mode to the second mode, wherein switching from the first mode to the second mode comprises:
switching from coupling the first clock path to the delay circuit to coupling the second clock path to the delay circuit and at a same time switching from inputting the first delay control signal to the control input of the delay circuit to inputting the second delay control signal to the control input of the delay circuit.

29. The method of any one of clauses 20 to 28, further comprising switching from the second mode to the first mode, wherein switching from the second mode to the first mode comprises:
switching from coupling the second clock path to the delay circuit to coupling the first clock path to the delay circuit and at a same time switching from inputting the second delay control signal to the control input of the delay circuit to inputting the first delay control signal to the control input of the delay circuit.

It is to be appreciated that the present disclosure is not limited to the exemplary terminology used above to describe aspects of the present disclosure. For example, a delay circuit including delay buffers coupled in series may also be referred to as a delay line. A delay buffer may also be referred to as a delay stage, a delay element, a delay unit, a delay cell, or another term. A control circuit may also be referred to a controller, control logic, or another term. A phase detector may also be referred to as a phase frequency detector, a phase comparator, or another term. A clock buffer may also be referred to as a clock driver, or another term.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. As used herein, the term "approximately" means within 10 percent of the stated value (i.e., within 90 percent to 110 percent of stated value).

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
   a first clock path;
   a second clock path;
   a delay circuit;
   a first multiplexer having a first input, a second input, and an output, wherein the first input of the first multiplexer is coupled to the first clock path, the second input of the first multiplexer is coupled to the second clock path, and the output of the first multiplexer is coupled to the delay circuit;
   a first delay control circuit having an input and an output, wherein the input of the first delay control circuit is coupled to the first clock path;
   a second delay control circuit having an input and an output, wherein the input of the second delay control circuit is coupled to the second clock path; and
   a second multiplexer having a first input, a second input, and an output, wherein the first input of the second multiplexer is coupled to the output of the first delay control circuit, the second input of the second multiplexer is coupled to the output of the second delay control circuit, and the output of the second multiplexer is coupled to a control input of the delay circuit.

2. The system of claim 1, wherein the first delay control circuit comprises a first delay-locked loop (DLL), and the second delay control circuit comprises a second DLL.

3. The system of claim 1, further comprising a clock transmitter, wherein the delay circuit is coupled between the output of the first multiplexer and the clock transmitter.

4. The system of claim 1, further comprising:
   a first clock source, wherein the first clock path is coupled between the first clock source and the first input of the first multiplexer; and
   a second clock source, wherein the second clock path is coupled between the second clock source and the second input of the first multiplexer.

5. The system of claim 4, wherein first clock path comprises first clock buffers, and the second clock path comprises second clock buffers.

6. The system of claim 4, wherein:
   the first clock source is configured to generate a first clock signal, and output the first clock signal to the first clock path; and
   the first delay control circuit is configured to receive the first clock signal at the input of the first delay control circuit via the first clock path, generate a first delay control signal based on the first clock signal, and output the first delay control signal at the output of the first delay control circuit.

7. The system of claim 6, wherein:
   the second clock source is configured to generate a second clock signal, and output the second clock signal to the second clock path; and
   the second delay control circuit is configured to receive the second clock signal at the input of the second delay control circuit via the second clock path, generate a second delay control signal based on the second clock signal, and output the second delay control signal at the output of the second delay control circuit.

8. The system of claim 7, wherein:
   the first delay control signal is configured to set a delay of the delay circuit to a first fraction of a cycle of the first clock signal; and
   the second delay control signal is configured to set the delay of the delay circuit to a second fraction of a cycle of the second clock signal.

9. The system of claim 8, wherein the first fraction and the second fraction are equal.

10. The system of claim 7, wherein a frequency of the first clock signal is different from a frequency of the second clock signal.

11. The system of claim 7, wherein the first delay control circuit comprises a first delay-locked loop (DLL), and the second delay control circuit comprises a second DLL.

12. The system of claim 1, further comprising a control circuit configured to:
   in a first mode, cause the first multiplexer to select the first input of the first multiplexer and cause the second multiplexer to select the first input of the second multiplexer; and
   in a second mode, cause the second multiplexer to select the second input of the first multiplexer and cause the second multiplexer to select the second input of the second multiplexer.

13. The system of claim 12, wherein, to switch from the first mode to the second mode, the control circuit is configured to:
   cause the first multiplexer to switch from the first input of the first multiplexer to the second input of the first multiplexer and at a same time cause the second multiplexer to switch from the first input of the second multiplexer to the second input of the second multiplexer.

14. The system of claim 12, wherein, to switch from the second mode to the first mode, the control circuit is configured to:
   cause the first multiplexer to switch from the second input of the first multiplexer to the first input of the first multiplexer and at a same time cause the second multiplexer to switch from the second input of the second multiplexer to the first input of the second multiplexer.

15. The system of claim 1, further comprising:
   a first clock source;
   a second clock source;
   a third clock source;
   a third multiplexer having a first input, a second input, and an output, wherein the first input of the third multiplexer is coupled to the first clock source, the second input of the third multiplexer is coupled to the third clock source, and the first clock path is coupled between the output of the third multiplexer and the first input of the first multiplexer; and
   a fourth multiplexer having a first input, a second input, and an output, wherein the first input of the fourth multiplexer is coupled to the second clock source, the second input of the fourth multiplexer is coupled to the third clock source, and the second clock path is coupled between the output of the fourth multiplexer and the second input of the first multiplexer.

16. The system of claim 15, wherein the third multiplexer comprises:
   an OR gate having a first input, a second input, and an output, wherein the output of the OR gate is coupled to the output of the third multiplexer;

a first clock gating circuit coupled between the first input of the third multiplexer and the first input of the OR gate; and a second clock gating circuit coupled between the second input of the third multiplexer and the second input of the OR gate.

17. The system of claim 1, further comprising:

a first clock source;

a second clock source;

a third clock source;

a fourth clock source;

a third multiplexer having a first input, a second input, and an output, wherein the first input of the third multiplexer is coupled to the third clock source, and the second input of the third multiplexer is coupled to the fourth clock source;

a fourth multiplexer having a first input, a second input, and an output, wherein the first input of the fourth multiplexer is coupled to the first clock source, the second input of the fourth multiplexer is coupled to the output of the third multiplexer, and the first clock path is coupled between the output of the fourth multiplexer and the first input of the first multiplexer; and a fifth multiplexer having a first input, a second input, and an output, wherein the first input of the fifth multiplexer is coupled to the second clock source, the second input of the fifth multiplexer is coupled to the output of the third multiplexer, and the second clock path is coupled between the output of the fifth multiplexer and the second input of the first multiplexer.

18. The system of claim 17, wherein the fourth multiplexer comprises:

an OR gate having a first input, a second input, and an output, wherein the output of the OR gate is coupled to the output of the fourth multiplexer;

a first clock gating circuit coupled between the first input of the fourth multiplexer and the first input of the OR gate; and a second clock gating circuit coupled between the second input of the fourth multiplexer and the second input of the OR gate.

19. The system of claim 17, further comprising:

a third clock path;

a sixth multiplexer having a first input, a second input, and an output, wherein the first input of the sixth multiplexer is coupled to the third clock source, the second input of the sixth multiplexer is coupled to the fourth clock source;

a seventh multiplexer having a first input, a second input, and an output, wherein the first input of the seventh multiplexer is coupled to the first clock path, the third clock path is coupled between the output of the sixth multiplexer and the second input of the seventh multiplexer, and the output of the seventh multiplexer is coupled to the input of the first delay control circuit; and an eighth multiplexer having a first input, a second input, and an output, wherein the first input of the seventh multiplexer is coupled to the second clock path, the third clock path is coupled between the output of the sixth multiplexer and the second input of the eighth multiplexer, and the output of the eighth multiplexer is coupled to the input of the second delay control circuit.

20. A method for clock switching, comprising:

propagating a first clock signal through a first clock path;

propagating a second clock signal through a second clock path;

generating a first delay control signal based on the first clock signal;

generating a second delay control signal based on the second clock signal;

in a first mode, coupling the first clock path to a delay circuit and inputting the first delay control signal to a control input of the delay circuit; and in a second mode, coupling the second clock path to the delay circuit and inputting the second delay control signal to the control input of the delay circuit.

21. The method of claim 20, wherein:

generating the first delay control signal based on the first clock signal comprises generating the first delay control signal based on the first clock signal using a first delay-locked loop (DLL); and generating the second delay control signal based on the second clock signal comprises generating the second delay control signal based on the second clock signal using a second DLL.

22. The method of claim 20, wherein:

the first delay control signal sets a delay of the delay circuit to a first delay; and the second delay control signal sets the delay of the delay circuit to a second delay, wherein the first delay and the second delay are different.

23. The method of claim 22, wherein:

the first delay is equal to a first fraction of a cycle of the first clock signal; and the second delay is equal to a second fraction of a cycle of the second clock signal.

24. The method of claim 23, wherein the first fraction and the second fraction are equal.

25. The method of claim 23, wherein a frequency of the first clock signal is different from a frequency of the second clock signal.

26. The method of claim 20, wherein generating the first delay control signal and generating the second delay control signal overlap during a time period.

27. The method of claim 26, further comprising:

receiving a signal indicating that the second DLL is locked during the time period; and switching from the first mode to the second mode after receiving the signal.

28. The method of claim 20, further comprising switching from the first mode to the second mode, wherein switching from the first mode to the second mode comprises:

switching from coupling the first clock path to the delay circuit to coupling the second clock path to the delay circuit and at a same time switching from inputting the first delay control signal to the control input of the delay circuit to inputting the second delay control signal to the control input of the delay circuit.

29. The method of claim 20, further comprising switching from the second mode to the first mode, wherein switching from the second mode to the first mode comprises:

switching from coupling the second clock path to the delay circuit to coupling the first clock path to the delay circuit and at a same time switching from inputting the second delay control signal to the control input of the delay circuit to inputting the first delay control signal to the control input of the delay circuit.

\* \* \* \* \*